United States Patent
Lerche et al.

(10) Patent No.: US 11,054,533 B2
(45) Date of Patent: Jul. 6, 2021

(54) SENSOR CHIP

(71) Applicant: FORSCHUNGSZENTRUM JUELICH GMBH, Juelich (DE)

(72) Inventors: Christoph Lerche, Herzogenrath (DE);
Arne Berneking, Karlsruhe (DE);
Nadim Joni Shah, Juelich (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 267 days.

(21) Appl. No.: 16/311,753

(22) PCT Filed: Jun. 20, 2017

(86) PCT No.: PCT/DE2017/000175
§ 371 (c)(1),
(2) Date: Dec. 20, 2018

(87) PCT Pub. No.: WO2018/014892
PCT Pub. Date: Jan. 25, 2018

(65) Prior Publication Data
US 2019/0204461 A1 Jul. 4, 2019

(30) Foreign Application Priority Data
Jul. 22, 2016 (DE) .............. 10 2016 008 904.0

(51) Int. Cl.
*G01T 1/24* (2006.01)
*G01T 1/164* (2006.01)
*H01L 27/146* (2006.01)
*H01L 31/02* (2006.01)

(52) U.S. Cl.
CPC ............ *G01T 1/248* (2013.01); *G01T 1/1647* (2013.01); *G01T 1/249* (2013.01); *H01L 27/14663* (2013.01); *H01L 31/02019* (2013.01)

(58) Field of Classification Search
CPC ....... G01T 1/1647; G01T 1/248; G01T 1/249; H01L 27/14663; H01L 31/02019
See application file for complete search history.

(56) References Cited

U.S. PATENT DOCUMENTS

| 7,476,864 B2 | 1/2009 | Benlloch Baviera et al. |
| 2013/0009267 A1* | 1/2013 | Henseler ................. G01T 1/248 257/443 |

(Continued)

FOREIGN PATENT DOCUMENTS

EP    2495585 A2    9/2012

OTHER PUBLICATIONS

Alberto Gola, et al., "A novel approach to Position-Sensitive Silicon Photomultipliers: First results", IEEE Nuclear Science Symposium conference record. Nuclear Science Symposium, Jan. 2013, pp. 1-4.

(Continued)

*Primary Examiner* — Michael C Bryant
(74) *Attorney, Agent, or Firm* — Leydig, Voit & Mayer, Ltd.

(57) ABSTRACT

An SiPM sensor chip includes pixels consisting of microcells Z, each pixel being associated with an xy position $x_1, x_2, x_3, \ldots, x_N$ or $y_1, y_2, y_3, \ldots, y_M$. A plurality of pixels form a block, and the microcells are connected to output channels for a linear coding.

17 Claims, 15 Drawing Sheets

(56) References Cited

U.S. PATENT DOCUMENTS

2016/0191829 A1 6/2016 Guo et al.
2019/0204461 A1* 7/2019 Lerche .............. H01L 27/14663

OTHER PUBLICATIONS

Volkmar Schulz, et al., "Sensitivity encoded silicon photomultiplier—a new sensor for high-resolution PET-MRI", Physics in Medicine and Biology, vol. 58, Jun. 20, 2013, pp. 4733-4748.
P. Fischer, et al., "Interpolating silicon photomultipliers", NIMPRA, Nov. 2012, pp. 1-13.
Samuel Espana, et al., "DigiPET: sub-millimeter spatial resolution small-animal PET imaging using thin monolithic scintillators", Physics in Medicine and Biology, vol. 59, Jun. 3, 2014, pp. 3405-3420.
Ch.W.Lerche, et al., "Depth of interaction detection for γ-ray imaging, Nuclear Instruments and Methods in Physics Research, vol. 60, Dec. 25, 2018, pp. 624-634.
Mikiko Ito, et al., Positron Emission Tomography (PET) Detectors with Depth-of-Interaction (DOI) Capability, Biomed Eng Lett, vol. 1, May 16, 2011, pp. 70-81.
Martin S Judenhofer, et al., "Simultaneous PET-MRI: a new approach for functional and morphological imaging", Nature Medicine, vol. 14, No. 4, Apr. 2008, pp. 459-465.
Sibylle I. Ziegler, et al., "A prototype high-resolution animal positron tomograph with avalanche photodiode arrays and LSO crystals, European Journal of Nuclear Medicine, vol. 28, No. 2, Feb. 2001, pp. 136-143.
Marcin Balcerzyk, et al., "Preliminary performance evaluation of a high resolution small animal PET scanner with monolithic crystals and depth-of-interaction encoding", 2008 $8^{th}$ IEEE International Conference on BioInformatics and BioEngineering, Oct. 8-10, 2008, pp. 1-4.
Marcin Balcerzyk, et al., "Initial performance evaluation of a high resolution Albira small animal positron emission tomography scanner with monolithic crystals and depth-of-interaction encoding from a user's perspective", Measurement Science and Technology, vol. 20, Sep. 4, 2009, pp. 1-7.
A.J. Gonzalez Martinez, et al., "Innovative PET detector concept based on SiPMs and continuous crystals", Nuclear Instruments and Methods in Physics Research A, vol. 695, Nov. 20, 2011, pp. 213-217.
Stefan Siegel, et al., "Simple Charge Division Readouts for Imaging Scintillator Arrays using a Multi-Channel PMT", IEEE Transactions on Nuclear Science, vol. 43, No. 3, Jun. 1996, pp. 1634-1641.
David P. McElroy, et al., "First Results From MADPET-II: A Novel Detector and Readout System for High Resolution Small Animal PET", 2003 IEEE Nuclear Science Symposium, Oct. 19-25, 2003, pp. 2043-2047.
Negar Omidvari, et al., "Characterization of Sensitivity Encoded Silicon Photomultiplier (SeSP) with 1-Dimensional and 2-Dimensional Encoding for High Resolution PET/MR", IEEE Transactions of Nuclear Science, vol. 62, No. 3, Jun. 2015, pp. 679-687.
Arne Berneking, "Characterization of Sensitivity encoded Silicon Photomultiplier for high resolution simultaneous PET/MR Imaging", Faculty of Electrical Engineering and Information Technology, Dec. 3, 2012, pp. 1-161.

* cited by examiner

SENSOR CHIP

CROSS REFERENCE TO RELATED APPLICATIONS

This application is a U.S. National Stage Application under 35 U.S.C. § 371 of International Application No. PCT/DE2017/000175 filed on Jun. 20, 2017, and claims benefit to German Patent Application No. DE 10 2016 008 904.0 filed on Jul. 22, 2016. The International Application was published in German on Jan. 25, 2018, as WO 2018/014892 A1 under PCT Article 21(2).

FIELD

The invention relates to a sensor chip that is suitable for a positron emission tomography detector ring.

BACKGROUND

According to the prior art, positron emission tomography detector rings are used to detect $\beta^+\beta^-$ annihilation radiation. The rings consist of scintillation crystals adjacent to sensors that are capable of detecting scintillation radiation. Typical detectors are SiPM (silicon photomultipliers). The structure is such that the detector ring is usually circular, with the object to be measured, for example a body part of a patient or animal, being placed in the center of the detector ring (PET ring). Through the use of radiodiagnostics, $\beta^+\beta^-$ annihilation radiation is generated that is to be detected. The $\beta^+\beta^-$ annihilation radiation, hereafter called annihilation radiation, strikes scintillation crystals arranged in a ring around the object to be examined and generates the scintillation radiation. The scintillation radiation, in turn, is registered by the SiPM, which is located behind the scintillation crystal in the concentric arrangement with respect to the radiation source. However, the SiPMs may also be disposed on other sides of the scintillation crystal, for example in front of or on the side of the scintillation crystal. The scintillation crystal is a three-dimensional body. Relative to an arrangement in which the object to be examined emits annihilation radiation from the center of the detector ring, the cross section on which the annihilation radiation strikes the scintillation crystal spans an xy axis. The depth of the scintillation crystal is referred to in this nomenclature as the z-axis. In an idealized representation, at the center of the detector ring is an object to be examined and/or an emission source for radiation of 511 keV energy, which ideally strikes the xy plane of the scintillation crystal perpendicularly and has a penetration depth along the z-axis of the scintillation crystal. The 511 keV annihilation radiation then initiates scintillation at a point on the scintillation crystal along the z-axis which is registered as a signal by the sensor, for example a SiPM. A SiPM is able to detect even single photons. When the minimum required light hits the active sensor surface, the SiPM microcell undergoes a diode breakdown. This generates a current pulse that can be measured at the output of the component. A so-called quench resistor prevents the cell from generating a critical current that becomes so high that it destroys the component. The output current of a SiPM microcell is independent of the amount of light that has reached the sensor and started the breakdown process. A SiPM microcell is a binary sensor that detects whether light is coming in or not. In order to obtain quantitative information about the incident light, a SiPM consists of a plurality of microcells. A microcell in this case consists of a photodiode and a passive quench resistor or another quenching means, such as an active quench transistor. The number of broken cells then gives information about the amount of incident light.

There is a correlation between the sensitivity of the scintillation crystal and its length along the z-axis. The deeper the scintillation crystal is dimensioned, the more sensitive it is, the more likely it is to have a scintillation event. In the detection of the annihilation radiation, from the point where the annihilation radiation is emitted, rays are emitted in two opposite directions so the rays make an angle of 180°. The line formed by these rays is called a "line of response" (LOR). Similarly, in an annular detector along the LOR, two rays strike scintillation crystals lying on opposite sides of the annular array at the center of which the emission source is located.

For detectors with light detection by photodiodes in the form of SiPMs on only one side of the scintillation crystal, several established methods exist for determining the x- and y-position of an event. However, these do not include the z-position so the exact position in the scintillation crystal is not determined where the gamma photon was stopped on the z-axis and converted to light. If the z-position is not co-determined, parallax errors occur due to the so-called depth of interaction problem (DOI problem) during the determination of the LOR. The DOI problem always occurs when the point from which the emission of annihilation radiation emanates is not exactly in the center in an annular detector. The farther the emission center for a LOR is outside the center of a PET ring, the bigger the problem becomes. Thus, in the design of a PET ring there is a trade-off between increasing sensitivity through longer scintillation crystals and reducing DOI errors due to shorter scintillation crystals. In some areas of the PET application there is a need to use close-fitting PET rings (detector rings) on the examination subject. This is particularly the case in medicine when patients are to be examined simultaneously with an MRI procedure and a PET procedure. The PET ring must then fit into the opening of the MRI scanner tube. As a result, the diameter of the PET ring used must be small enough for it to fit into the opening of the MRI ring. Given a small dimensioning of the PET ring, however, there is the problem that the object to be examined, for example a body part of a small animal or of a human being, although centered, is dimensioned to the diameter of the PET ring so that it extends far into the edge regions of the opening of the PET ring. However, even points from which annihilation radiation emanates are positioned so close to the PET ring that the DOI problem becomes significant.

In recent years in particular, the resolution has been significantly improved in small animal PET scanners with the use of pixilated scintillation crystal blocks with smaller and smaller pixel sizes. In this case, the pixelization is realized on the xy plane, so that tubes of pixels aligned in the z-direction are formed in the scintillation crystal. This was particularly promoted by the need for ever higher spatial resolution in small animal PET scanners, since the object under investigation is very small. Meanwhile, the pixel size has already reached the submillimeter range. That is why there are increasingly two problems that need to be solved. First, the pixilated crystal blocks consist of adhesive and reflector foil located between the individual scintillation crystals to build up the pixilated block. The layer of adhesive and reflector foil has an approximate thickness of 70 µm. As a result, pixilated arrays with particularly small pixel pitch have an increased sensitivity loss. In the case of an array with 0.8 cm×0.8 cm crystal pixels, as used for example in [1], the ratio of adhesive and film to scintillation crystal decreases significantly so that adhesive and film already comprise a 29% proportion. The scintillation crystal fraction is consequently reduced to 71%. In the other 29% volume no gamma quanta can be stopped and converted into light. If even smaller pixilated arrays of, for example, 0.5 cm×0.5 cm are used, the crystal fraction is even reduced to 59%. Therefore, increasing the resolution with pixilated arrays always entails a loss of sensitivity. The second problem with pixilated scintillation crystal arrays is that the emitted light is concentrated on a smaller area of the SiPM detector surface. A SiPM consists of several microcells that function as binary elements. They detect whether or not light has been detected. When light is detected, the microcell breaks down. The number of broken microcells quantify how much light has reached the detector surface. When two or more light quanta trigger a microcell, the output signal remains the same. The more light that hits a SiPM, the higher the likelihood that two or more light quanta will hit the same microcell of the SiPM. These additional light quanta then cannot be detected. Consequently, the probability of saturation of a microcell is significantly higher when using pixilated scintillation crystal arrays because they focus the light more intensely on a small area of the sensor. Saturation effects also result in a poorer energy resolution of the detectors.

As mentioned at the outset, prior art detectors use SiPM-based sensor technologies to enable magnetic resonance imaging (MRI) compatibility for use in MR/PET hybrid scanners. Another problem with hybrid scanners is that the space for PET detectors and associated electronics is limited by the tube diameter of the magnetic resonance imaging (MRI) system. This is especially true for ultra-high field tomographs. As a consequence of the narrower tube diameter, the PET scintillation crystals must be as short as possible. Shorter scintillation crystals also reduce the sensitivity. This also means that due to the conditions of the tube diameter the PET ring is closer to the examination subject. The parallax error is greater the closer the annihilations and thus the resulting LOR on the PET ring. This is because if the annihilation occurs close to the PET ring, the gamma quanta will no longer be incident perpendicular to the scintillation crystals. The consequence of this in the PET ring design is that the parallax errors increase and become more significant when the PET ring is close to the object to be examined, since in this case annihilation can also take place close to the PET ring. Apart from hybrid device limitations, the aim is to design PET rings as narrow as possible due to higher sensitivity and lower costs.

Furthermore, it is known that many SiPM sensor concepts include a coding of the output channels, since increasing the output channels raises the power consumption of the PET ring. However, this is limited by design. A simple calculation makes this clear. A PET ring with a diameter of 8 cm and a length of 10 cm results in a detector surface of 251 cm$^2$. If a 1-to-1 coupling of scintillation crystals and SiPMs with a crystal pixel size of 0.8 mm is used, 39270 read-out channels are already required if each channel is read out individually.

To achieve higher spatial resolutions, current sensor designs consist of sensor chips with narrower pixel sizes. This leads to a significant increase in the readout channels, which are limited by the power consumption, space and data rates. As a consequence, position-sensitive (PS) encoding methods have been developed to reduce the number of read-out channels of a chip [1-3, 15]. A recently developed concept is called linearly-graded SiPM (LG-SiPM) [1] and is based on charge-splitting PS-SiPMs. Charge-splitting PS-SiPM microcells detect light like conventional SiPM microcells. However, this sensor concept involves a resistor network that distributes the generated charge depending on position and coding. The detector design presented in [1] consists of a pixilated crystal array with a pitch of 0.8 mm. On the other hand, light-splitting methods under the names sensitivity encoded SiPM (SeSP) and interpolating SiPM (iSiPM) were developed and published and characterized in [2-3, 15]. These methods have the advantage that no resistor network is required for position coding; instead, the position coding is realized via interconnection of microcells.

These most recent detector concepts provide the advantage of output channel reduction through channel coding coupled with high detector array resolution achieved by the use of pixilated scintillation crystal arrays spaced less than one millimeter apart. However, it does not include DOI information detection.

A concept published in [4] proves the possibility of constructing a PET detector consisting of monolithic crystals and SiPMs. As mentioned earlier, monolithic crystals solve the problem of loss of sensitivity due to the space required by reflector films and associated adhesives. In addition, the production costs of monolithic crystals are lower as a result. The used thickness of the crystals is 2 mm. As a result, parallax errors are avoided with the structure used in [4] but this is achieved by the small expansion of the scintillation crystal in the z-direction. At the same time, however, the detection efficiency due to the low crystal height is low.

There are various ways to measure DOI information and thus correct parallax errors that additionally detect light on another crystal side. Especially for SiPMs of the prior art, this increases costs immensely. A concept for DOI detection that detects light on only one side of the crystal using monolithic crystals is published in [5] and patented in [6]. It uses the well-known principle that the light distribution of the crystal is dependent on the DOI. The detector concept used is coupled with monolithic crystals on the Hamamatsu position-sensitive photomultiplier (PMT) H8500. In addition, a resistor network is used that allows position coding and thus also output channel reduction. The standard deviation of the light distribution is used to estimate the DOI. To calculate the standard deviation requires the first- and second-order moments of the light distribution. The first-order moment is already given by the linear coding of the output channels. To determine the second-order moment a sum network has been developed and integrated into the resistor network.

An overview of PET detectors with DOI detection is summarized in [7]. Descriptions and results of small animal PET and MR/PET hybrid scanners developed in recent years can be found in [8-11].

Detector concepts that use current SiPM-based technology and include position coding for channel reduction do not include DOI detection. Therefore, PET rings constructed with these detectors involve parallax errors in the reconstruction. In addition, most use pixilated crystal arrays. As described above, this leads to a loss of sensitivity due to the reflector film and the adhesive between the crystals of the array. Due to the lack of DOI information, one is limited in the thickness of the crystals. An increase in sensitivity due to thicker crystals is accompanied by a loss of spatial resolution due to a lack of DOI information. The DOI concepts for pixilated crystals mentioned in [7] cannot be used with arbitrarily small crystals and do not work for crystal arrays with 0.8 mm or 0.5 mm crystal sizes. The main problem with missing DOI detection is that the PET ring size is limited and a narrower ring would reduce the spatial resolution.

The detector described in [4] is realized with monolithic crystals. A close-fitting ring was designed to increase sensitivity. At the same time monolithic crystals were used. Due to the resulting short distance between the scintillation crystals and the examination subject, the DOI problem is increased. Therefore, the developers of the ring are limited to 2 mm crystal thickness. As a result, the sensitivity gained through the narrow ring and the use of monolithic crystals is lost again due to the small thickness of the scintillation crystals. However, this work proves that high resolution with monolithic crystals is possible.

DOI positions with SiPM-based detectors can be determined by attaching sensors to two crystal surfaces. These require double SiPM sensor area. Currently, SiPM sensors are one of the most expensive components of a PET ring.

The concept realized in [5, 6] uses position-sensitive PMTs that cannot be used in strong magnetic fields. As a result, they are not MRI compatible. The concept can be realized with MRI-compatible avalanche photodiodes (APD). APDs are photodiodes that experience an avalanche effect, which accelerates light-generated photoelectrons and activates more electrons. The resulting photocurrent depends on the light intensity, as is the case with PMTs. In the same way, the concept can be realized with SiPM sensors by interconnecting the output channels of the SiPM sensors, just as with the APDs. A realization at the SiPM microcell level is a completely new challenge, since SiPM microcells are binary sensors and are operated in another mode, the so-called Geiger mode.

A three-dimensional animal PET scanner was integrated by Judenhofer et al. [8] in a 7T animal scanner. It is based on APDs using scintillation crystals 4.5 mm thick and consisting of crystal arrays of 144 crystals spaced 1.6 mm apart. The crystal array is coupled to a 3 by 3 APD array. The axial field of view (FOV) is 19 mm. This developed system shows that the space is particularly limited, especially for integrated systems, which forces a compromise between crystal thickness and axial FOV. This results in the system's low sensitivity of 0.23%. In addition, the DOI problem also limits the crystal thickness here.

Another prototype scanner, released under the name MADPET, was developed in its first version in Munich [9]. It is realized with APDs directly coupled to 3.7 mm×3.7 mm×12 mm crystals. This prototype scanner shows the problem of increasing the readout channels when using 1-to-1 coupling. In the first scanner it is not possible to read all channels at the same time. In addition, low sensitivity is a problem of the scanner. In a second version of the scanner, MADPET II, this problem has been solved and the readout of all APDs is possible [14]. The second version also features a two-layer readout system, with two layers of crystals with intermediate APDs. Since the crystals are divided accordingly, DOI positions can also be determined. However, it also requires twice the amount of sensor surfaces so the readout channels are increased again. In addition, the approximately double number of sensors causes higher costs.

The possibility of DOI detection with position-sensitive PMTs has been demonstrated in [10, 11].

Research results with detectors consisting of SiPMs and monolithic crystals are published in [12]. In this approach, SiPMs are used in the same way as the original concept for PMTs and APDs was published in [5, 6].

SUMMARY

In an embodiment, the present invention provides an SiPM sensor chip. The SiPM sensor chip includes pixels consisting of microcells Z, each pixel being associated with an xy position x1, x2, x3, . . . , xN or y1, y2, y3, . . . yM. A plurality of pixels form a block, and the microcells are connected to output channels for a linear coding. In the case of a one-dimensional linear coding in at least one row m of M rows, N pixels x1, x2, . . . , xN are present in the x direction, and within this row a linear coding is produced in that, within the m rows, the number of microcells of a pixel ending in an output channel Am belonging to the mth row changes in the progressive direction from x1 to xN in a numerically decreasing manner, and the number of microcells of a pixel ending in the output channel Bm belonging to the mth row changes in a numerically ascending manner, so that the number of microcells interconnected with Am or Bm inversely changes linearly with progressing pixels in a row in the x direction, resulting in a linear coding. In the case of a one-dimensional linear coding in at least one column n of N columns, M pixels y1, y2, . . . , yM are present in they direction, and within this column a linear coding is produced in that, within the n columns, the number of microcells of a pixel ending in the output channel An belonging to the nth column changes in the progressive direction from y1 to yM in a numerically decreasing manner, and the number of microcells of a pixel ending in the output channel Bn belonging to the nth column changes in a numerically ascending manner, so that the number of microcells interconnected with An or Bn inversely changes linearly with progressing pixels in a column in the y direction, resulting in a linear coding. In the case of a two-dimensional linear coding in at least one row m of M rows, N pixels x1, x2, . . . , xN are present in the x direction, and within this row a linear coding is produced in that, within the m rows, the number of microcells of a pixel ending in a shared output channel A changes in the progressive direction from x1 to xN in a numerically decreasing manner, and the number of microcells of a pixel ending in a shared output channel B changes in a numerically ascending manner, so that the number of microcells interconnected with A or B inversely changes linearly with progressing pixels in a row in the x direction, and that in at least one column n of N columns, M pixels y1, y2, . . . , yM are present in the y direction, and within this column a linear coding is produced in that, within the n columns, the number of microcells of a pixel ending in a shared output channel C changes in the progressive direction from y1 to yM in a numerically decreasing manner, and the number of microcells of a pixel ending in a shared output channel D changes in a numerically ascending manner, so that the number of microcells interconnected with C or D inversely changes linearly with progressing pixels in a column in the y direction, resulting in a linear coding. A linear coding is present if a coding is realized according to $h_1 \cdot x^{h_2} + h_3$ $h_4 \cdot y^{h_5} + h_0$ $h_1, h_3, h_4, h_6 = \text{const.} \in [0, \infty)$ $0.5 < h_2, h_6 < 1.5.$ A summing network O or two summing networks O are implemented, consisting of one network or two networks $N_S$ and coder resistors $R_e$ through which the photocurrents of the microcells Z flow, and leading to a voltage distribution through the summing network O or the summing networks O satisfying the distribution formula:

$$p(x,y)=(x-\beta_1)^{(2w_1)^{\alpha_1}}(y-\beta_2)^{(2w_2)^{\alpha_2}}$$

$$\beta_1,\beta_2=\text{const.}\in[0,\infty)$$

$$\omega_1,\omega_2=1,2,3\ldots$$

$$0.5<\alpha_1,\alpha_2<1.5$$

or $$p(x)(x)=(x-\beta_1)^{(2w_1)^{\alpha_1}}$$

$$p(y)=(y-\beta_2)^{(2w_2)^{\alpha_2}}$$

$$\beta_1,\beta_2=\text{const.}\in[0,\infty)$$

$$\omega_1,\omega_2=1,2,3\ldots$$

$$0.5<\alpha_1,\alpha_2<1.5$$

which can be coded along x or y or x and y.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
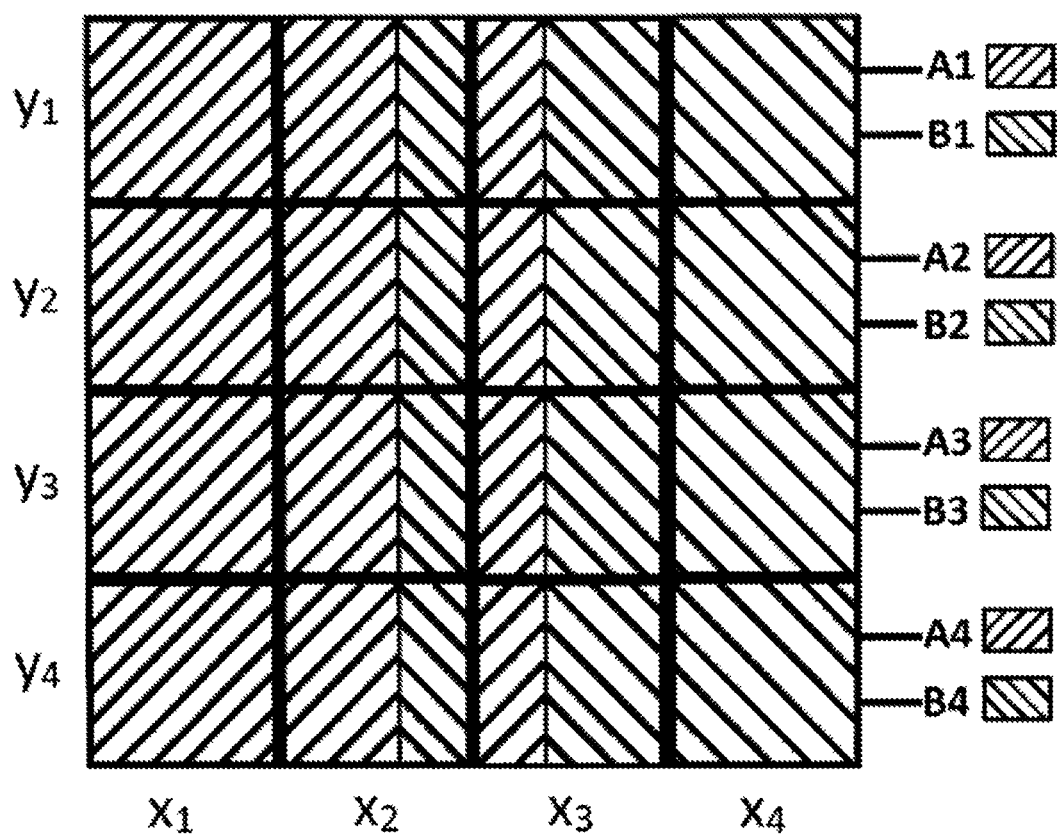
FIG. 1 illustrates a sensor chip coded one-dimensionally in the x direction.

Embodiments of the invention provide a sensor chip configured to overcomes disadvantages of the prior art by which the parallax error in determining a LOR can be reduced. Embodiments of the invention provide sensor chips that enable use of scintillation single crystals for the detection of signals in positron emission tomography, where the DOI problem can be avoided by reducing the parallax error in the determination of the LOR.

The sensitivity and resolution of the sensor chips are improved. Furthermore, the sensor chips are suitable to be operated together with an MRI, in particular at high magnetic fields. The accuracy of small-sized PET rings or PET rings that are close to the examination subject are improved. The space required by the electronics associated with the measuring arrangement are reduced. The cost of the devices are reduced. The sensor chips are not limited in their application to use in PET, but are generally usable for scintillation single crystals or other scintillation mechanisms where the light distribution depends on the depth of interaction.

Sensor chips according to the invention provide for reducing parallax errors in determination of the LORs, in particular in scintillation single crystals. The sensitivity and resolution of the measuring method and the device are substantially improved. Use of longer scintillation single crystals in the z direction is possible. The detector can be operated together with an MRI device. Particularly in the case of devices with a small dimensioning or if the PET ring is in close contact with the examination subject, the parallax error is reduced. There is space for the associated electronics and costs are saved. The sensor chip according to the invention achieves a very high level of detail accuracy since the number of scans of the light distribution function is significantly increased because scanning is within a sensor pixel and even scanning at the microcell level is possible. This increases the granularity by a factor that, depending on the implementation methods described later, is up to 160 or higher compared with conventional SiPMs in the case of photomultipliers or avalanche diodes. This yields a more accurate determination of the second-order moment.

In the following the invention is described in its general form, without this to be construed restrictively.

A detector concept for PET measurements is provided in which each individual detector comprises a scintillation single crystal and at least one sensor chip positioned on one side of the scintillation crystal. Preferably, the sensor chip is mounted on the xy plane of the scintillation single crystal, especially preferably on the side of the scintillation single crystal facing away from the center of the detector ring. In another embodiment, the sensor chip may be attached to a side of the scintillation single crystal that is not on the xy plane, for example, on the xz or yz plane. However, this has the disadvantage that for scanner chips mounted on the xz or yz plane, scanner sensitivity losses result. If the sensor is located on the side facing the center, additional Compton effects result.

It is also possible to couple multiple scintillation single crystals to one sensor chip.

The use of the scintillation single crystal has the advantage that the sensitivity of the single crystal relative to pixelated scintillation crystals can be maximized. In the case of pixelated scintillation crystals, the efficiency of the scintillation single crystals is significantly reduced, for example to only 71% or 59% at 0.8 mm×0.8 mm or 0.5 mm×0.5 mm crystal pixel size of a pixelated crystal array. The scintillation single crystal can, for example, but not restrictively, be made up of LSO, LYSO, BGO, GSO, BaF$_2$ or NaI:Tl (thallium-doped sodium iodide). In addition, the use of any other scintillation material showing a depth-dependent light distribution is possible. The materials are known to a person skilled in the art. The ratio of the z component of the scintillation single crystal to its extension in the x direction of less than or equal to 1 leads to good results with square cross section for xy. The best results are obtained at a ratio of 0.25. Optionally, the ratio may also be smaller. The length of the scintillation single crystal achieved in this case is determined more by practical circumstances, such as the diameter of the PET ring or the costs associated with large single crystals. The sizing of the scintillation single crystal in the z-direction depends on the desired sensitivity to be achieved. Achieving the large expansion of the scintillation single crystal in the z-direction is a result of the inventive design of the sensor chip described below, which enables a sizing in which there is a minimization of DOI errors.

The sensor chip according to the invention is a SiPM and consists of SiPM microcells.

On a scintillation single crystal, one sensor chip or a plurality of small sensor chips can be applied that are assembled to form a larger sensor chip. These can be adhered to the scintillation single crystal. If several small sensor chips are combined, these are considered a single sensor chip according to the invention when they are mounted together on one side of the scintillation single crystal. The adhesive used should be translucent. Furthermore, a layer of a light distributor may be located between the scintillation single crystal and the sensor chip if the light intensity is too focused. An arrangement is also possible in which more than one sensor chip is attached to the single crystal. For example, there may be stacking along the z-axis where sensor chips and scintillation single crystals alternate. This is particularly useful when scintillation single crystals are used in which the light distribution in certain crystal regions cannot be so strongly differentiated and a division of the scintillation single crystal into several layers, each with one sensor, makes sense. In another embodiment, sensor chips may also be mounted on the sides of the scintillation single crystal that are not on the xy plane of the scintillation single crystal. There can be one, two or more, e.g. three sensor chips mounted on different sides. Sensor chips may be mounted on two opposite sides of the scintillation single crystal or on adjacent sides of the scintillation single crystal lying in the xz or yz direction. Any sub-combination is conceivable. The variant in which sensor chips are mounted on opposite sides has the advantage of increasing the accuracy when a measurement signal is received. According to the invention's embodiment of the method and device, however, there is the particular advantage that the signals need only be read out on one side of the scintillation single crystal. This corresponds to an embodiment with a single sensor chip. Thus, the inventive method and the device are also inexpensive.

The sensor chip according to the invention consists of a plurality of pixels, distinguished by the fact that each pixel is assigned its own xy position. A pixel consists of a plurality of photodiodes D with associated quench resistors R$_q$. In another embodiment, the visible subdivision of pixels is not necessary. In this case the pixels are arranged at distances from one another corresponding to the distances of the microcells, so that a local homogeneous distribution of the microcells results over the active sensor surface.

Instead of a quench resistor the quenching process can also be initiated by active quenching using methods known to a person skilled in the art, e.g. using a transistor. In the following description, a quench resistor R$_q$ is disclosed in the disclosed embodiments. However, in all embodiments another equivalent means of quenching, such as a transistor, may be used so the disclosure is not limited to use of a quenching resistor.

The photodiodes in this case are connected to a supply voltage V$_{ref}$. The quench resistors R$_q$ are preferably equal in size and are in a range of 1 megohm to 1000 megohms. The supply voltage, which can also be called bias or reference voltage, may be between −20 volts and −60 volts depending on the manufacturing technology. A SiPM microcell consists of a photodiode D and a quench resistor R$_q$ and below is called microcell Z. In a pixel there can be arranged, for example, but not restrictively, between 2×2 and 1000×1000 microcells, e.g. 10×10 or 100×100 microcells Z. The microcells Z can be arranged in a grid in which the microcell positions in a uv coordinate system occupy columns and rows. The arrangement of the microcells Z is preferably in an orthogonal grid with the same number of microcells Z in the u direction and in the v direction. The arrangement then contains I columns in u-direction $u_i=u_1, u_2, u_3, \ldots, u_I$ where i=1, 2, . . . , I and J rows in the v-direction $v_j=v_1, v_2, v_3 \ldots, v_J$ where j=1, 2, . . . , J.

The pixels are in turn arranged in a grid in which the pixels are arranged in rows in the x direction and in the y direction. The pixels are in rows or columns preferably arranged in parallel with the x-axis and the y-axis. Typically 4, 8, 16 or more pixels are arranged in each of the x direction and the y direction. An upper limit for the number of pixels results more from practical reasons, for example 64 (=8×8). The arrangement then contains N columns in the x direction $x_n=x_1, x_2, x_3, \ldots, x_N$ where n=1, 2, . . . , N and M rows in the y direction $y_m=y_1, y_2, y_3, \ldots, y_M$ where m=1, 2 . . . , M. The directions x and y or u and v of the pixels and the microcells Z are preferably arranged orthogonal to one another, but they may also be arranged at an angle that deviates from 90° so that a diamond pattern is produced.

The arrangement of the pixels forms a block. A sensor chip may have a plurality of blocks arranged in a grid.

In general, the number of microcells Z of a pixel, which are interconnected in each case, varies so that the individual photocurrents of the interconnected microcells Z are combined to form a signal and are connected to one of the readout channels, with the position of the pixels along the x or y direction. The position can then be determined from the ratio of the photocurrents. The position coding for the xy position of a pixel is carried out according to the invention by linear coding, wherein the xy coding is given by the quantitative composition of the pixels on microcells Z linearly changing through the positions $x_1, x_2, x_3 \ldots x_N$ supplied to one of two channels for the x direction and/or $y_1$, $y_2, y_3 \ldots y_N$ in one of two channels for the y direction. Ideally, the changing linear composition of the microcells Z supplied to one of the x direction channels and/or one of the y direction channels should be strictly linear. However, deviations from linearity are also possible as long as they only insignificantly influence the resulting xy position coding so that an xy position determination of the scintillation event is still possible. In practice this depends on many different factors, such as the number of selected microcells Z per pixel or the filling factor.

The sensor chip according to the invention uses either a 1-dimensional (1D) or 2-dimensional (2-D) xy position coding. In the case of a 1D coding, the microcells Z can be interconnected with at least two channels. In each case 2 channels are needed for one column or row of pixels. In 2D coding, a total of 4 readout channels are required to which the channels are interconnected and split.

Linear coding within the meaning of the invention means any coding that satisfies the formula $$h_1 \cdot x^{h_2} + h_3$$

$$h_4 \cdot y^{h_5} + h_6$$

$$h_1, h_3, h_4, h_6 = \text{const.} \in [0, \infty)$$

$$0.5 < h_2, h_5 < 1.5 \quad \text{(Formula 1)}.$$

Formula 1 takes into consideration that embodiments that do not meet the requirements of strict linearity may still be suitable for realizing the teaching according to the invention.

First, the 1-dimensional case will be explained.

In the one-dimensional case, encoding is in either the x direction or the y direction.

The coding is described by means of an encoding in the x direction, but it works analogously for an encoding in the y direction. Here, a sensor chip consists of pixels arranged in N columns and M rows. The microcells Z of each row m are connected to channels $A_m$ and $B_m$. A linear ratio of the summed photocurrents $I_{Ph}(A_m)$ and $I_{Ph}(B_m)$ of the microcells Z connected to the channels $A_m$ and $B_m$ based on the total photocurrent $I_{Ph,ges}$ of a pixel is given for $$I_{Ph}(A_m) = I_{Ph,ges} \ast (N+1-n)/N \text{ and}$$

$$I_{Ph}(B_m) = I_{Ph,ges} \ast (n-1)/N$$

so that the x position is determined by the formula $$x = \frac{\sum_1^M A_m - \sum_1^M B_m}{\sum_1^M (A_m + B_m)} \quad \text{(Formula 2)}$$

and the y position by the formula $$y = \max(I_{Ph}(A_m) + I_{Ph}(B_m)), \text{ where } m=1, \ldots, M, \quad \text{(Formula 3)}$$

When coded in the y direction, the microcells Z of each column n are connected to channels $A_n$ and $B_n$.

The same relationships apply to the y direction.

Here, a sensor chip consists of pixels arranged in N columns and M rows. The microcells Z of each column n are connected to channels $A_n$ and $B_n$. A linear ratio of the summed photocurrents $I_{Ph}(A_n)$ and $I_{Ph}(B_n)$ of the microcells Z connected to the channels $A_n$ and $B_n$ based on the total photocurrent $I_{Ph,ges}$ of a pixel is given for $$I_{Ph}(A_n) = I_{Ph,ges} \ast (M+1-m)/M \text{ and}$$

$$I_{Ph}(B_n) = I_{Ph,ges} \ast (M-1)/M$$

so that the y position is determined by the formula $$y = \frac{\sum_1^N A_n - \sum_1^N B_n}{\sum_1^N (A_n + B_n)} \quad \text{(Formula 4)}$$

and the x position by the formula $$x = \max(I_{Ph}(A_n) + I_{Ph}(B_n)), \text{ where } n=1, \ldots N. \quad \text{(Formula 5)}$$

In the two-dimensional case, encoding is in the x direction and in the y direction. Here, a sensor chip consists of pixels arranged in N columns and M rows.

The microcells Z of each position of each pixel mn are connected to channels A, B, C and D. The x position is determined by channels A and B. The y position is determined by the channels C and D. A linear ratio of the summed photocurrents $I_{Ph}(A)$ and $I_{Ph}(B)$ as well as $I_{Ph}(C)$ and $I_{Ph}(D)$ of the microcells Z connected to the channels A and B and C and D based on the total photocurrent $I_{Ph,ges}$ of a pixel is given for $$I_{Ph}(A) = I_{Ph,ges} \ast (N+1-n)/(NM),$$

$$I_{Ph}(B) = I_{Ph,ges} \ast (n-1)/(NM),$$

$$I_{Ph}(C) = I_{Ph,ges} \ast (M+1-m)/(NM) \text{ and}$$

$$I_{Ph}(D) = I_{Ph,ges} \ast (m-1)/(MN),$$

so that the x position is determined by the formula $$x = (I_{Ph}(A) - I_{Ph}(B))/(I_{Ph}(A) + I_{Ph}(B)) \quad \text{(Formula 6)}$$

and the y position by $$y = (I_{Ph}(C) - I_{Ph}(D))/(I_{Ph}(C) + I_{Ph}(D)) \quad \text{(Formula 7)}$$

In a first embodiment, the respective microcells Z of a pixel leading to the channels $A_m$ and $B_m$ or $A_n$ and $B_n$ or A, B and C or D, are statistically random or distributed in a checkerboard pattern. The distribution of microcells Z, which end in the channels $A_m$ and $B_m$ or $A_n$ and $B_n$ or A, B, C and D, can be arbitrarily arranged at a given ratio. A uniform distribution over the sensor chip of microcells Z connected to the channels $A_m$ and $B_m$ or $A_n$ and $B_n$ or A, B, C and D has the advantage that the position of the incident light on the sensor can be more accurately determined, since the ratio of the microcells Z connected to the channel $A_m$ and $B_m$ or $A_n$ and $B_n$ or A and B or C and D even in subpixel resolution is the same.

In an alternative embodiment, a spatial division additionally takes place within the pixels. In this embodiment there are N pixels of a row along the x-axis and M pixels of a column along the y-axis. Within a row or column, the composition of the number of microcells leading to the channel $A_m$ or $B_m$ or $A_n$ or $B_n$ or A or B or C or D is quantitatively as shown above.

Along N pixels of the x-axis with the pixel positions $x_1$, x2, . . . , $x_N$, if there is an additional local distribution the microcells of a pixel leading to the channel $A_m$ or A are spatially located on the side associated with the position $x_1$ and the microcells of the same pixel that lead to the channel $B_m$ or B are located on the side nearer the $x_N$ position.

The microcells that lead to the channel $A_m$ or A can be separated from the microcells that lead to the channel $B_m$ or B by a discrete border. The transition of the distribution of microcells to the channels $A_m$ and $B_m$ or A and B, however, can also be fluid.

Along M pixels of the y-axis with the pixel positions $y_1$, $y_2$, . . . , $y_M$, with an additional local distribution the microcells of a pixel that lead to the channel $A_n$ or C are locally located on the side associated with the position $y_1$ and the microcells of the same pixel that lead to the channel $B_n$ or D are located on the side nearer the position $y_M$.

The microcells that lead to the channel $A_n$ or C can be separated from the microcells that lead to the channel $B_n$ or D by a discrete border. The transition of the distribution of microcells to the channels $A_n$ and $B_n$ or C and D, however, can also be fluid.

In the structural arrangement, the linear coding is realized by the type of distribution of the leads from the microcells to the channels $A_m$ and $B_m$ in the x direction or $A_n$ and $B_n$ in the y direction in the 1D case or A, B, C and D in the case of a 2D coding.

A row m of pixels in the x direction contains in the case of a 1D coding in the x direction N pixels $x_1, x_2 \ldots x_N$. Within a row m with N pixels linear coding is realized, because within the m row the number of microcells of a pixel ending in the output channel $A_m$ changes in the progressive direction from $x_1$ to $x_N$ in a numerically decreasing manner and the number of microcells of a pixel ending in the output channel $B_m$ changes in a numerically ascending manner so that the number of microcells interconnected with $A_m$ or $B_m$ inversely changes linearly in a row in the x direction, resulting in a linear coding.

The same applies to the columns in the y direction in the case of a 1D coding in they direction. A column n of pixels in they direction contains M pixels $y_1 y, \ldots y_M$. Within a column n with M pixels a linear coding is realized, because within the n column the number of microcells of a pixel flowing ending in the output channel $A_n$ progressively changes from $y_1$ to $y_M$ in a numerically decreasing manner, and the number of microcells of a pixel ending in the output channel $B_n$ in a numerically ascending manner so that the number of microcells interconnected with $A_n$ or $B_n$ inversely changes linearly in a column in the y direction, resulting in a linear coding.

In the case of two-dimensional coding, the coding takes place as a combination of the coding for the x direction and for the y direction for a sensor chip with n*m pixels. In this case, each pixel is divided into two sets that lead to channels A and B and into channels C and D, respectively. While maintaining the quantity distribution for the relevant arrangement of the microchannels that lead to the channels $A_m$, $B_m$ or $A_n$ and $B_n$, each pixel is subdivided into two sets of microcells encoding A and B as well as C and D, with the ratios changing linearly in each set of microcells within the individual regions for A and B and within the regions for C and D.

For this purpose, the SiPM sensor chip according to the invention is designed so that in the case of a two-dimensional linear coding in at least one row m of M rows, N pixels $x_1, x_2, \ldots, x_N$ are present in the x direction, and within this row a linear coding occurs in that within the m rows the number of microcells of a pixel that end in a common output channel A changes in the progressive direction from $x_1$ to $x_N$ in a numerically decreasing manner and the number of microcells of a pixel that lead to a common output channel B changes in a numerically ascending manner, so that the number of microcells interconnected with A or B inversely changes linearly in a row in the x direction and, in at least one column n of N columns, M pixels $y_1, y_2, \ldots, y_M$ are present in the y direction, and within this column a linear coding results from the fact that within the n columns the number of microcells of a pixel ending in a common output channel C changes in the progressive direction from $y_1$ to $y_M$ in a numerically decreasing manner and the number of microcells of a pixel ending in a common output channel D changes in a numerically ascending manner, so that the number of microcells interconnected with C or D inversely changes linearly with progressing pixels in a column in the y direction, resulting in a linear coding.

In the alternative embodiment, the numerically continuous change of the number of microcells ending in the channels $A_m$ and $B_m$ for the x direction, or $A_n$ and $B_n$ for the y direction in the case of a 1D coding or the channels A, B, C and D in the case of a 2D coding, is additionally manifested in a local distribution of these microcells within the sensor pixels.

In the case of 1D coding in the x direction, within a row m with N pixels the microcells that lead to the channel $A_m$ in each individual pixel $x_1, x_2, \ldots x_N$ are locally arranged such that the microcells that lead to the channel $A_m$ within each pixel in the direction of the pixel $x_1$ are arranged to be more numerous than in the direction toward the pixel $x_N$. Conversely, the microcells that lead to the channel $B_m$ are arranged as more numerous within each pixel in the direction of the pixel $x_N$ than in the direction toward the pixel $x_1$. The transition may be fluid. In one embodiment, the microcells that lead to the channel $A_m$ are located within each pixel in the direction of the pixel $x_1$ only on the side of the pixels that are in the direction $x_1$ and the microcells leading to the channel $B_m$ within each pixel in the $x_N$ direction are located exclusively on the side of the pixel that is in the direction $x_N$, forming a dividing line. The pixel $x_1$ can only have microcells that lead to the channel $A_m$. The pixel $x_N$ can only have microcells that lead to the channel $B_m$.

The same applies to the 1D coding in the y direction. Within a column n with M pixels, the microcells leading to the channel $A_n$ are locally arranged in each individual pixel $y_1, y_2, \ldots y_M$ such that the microcells leading to channel $A_n$ are arranged within each pixel in the direction of pixel $y_1$ as more numerous than in the direction toward the pixel $y_N$. Conversely, the microcells leading to the channel $B_n$ are arranged as more numerous within each pixel in the direction of the pixel $y_M$ than in the direction toward the pixel $y_1$. The transition can be fluid.

In one embodiment, the microcells leading to the channel $A_n$ are located within each pixel in the direction of the pixel $y_1$ exclusively on the side of the pixel that is in the direction $y_1$ and the microcells leading to the channel $B_n$ are located within each pixel in the direction of the pixel $y_M$ exclusively on the side of the pixel that is in the direction $y_M$, forming a dividing line. The pixel $y_1$ can only have microcells that lead to the channel $A_n$. The pixel $y_M$ can only have microcells that lead to the channel $B_n$.

In the case of two-dimensional coding, the coding takes place as a combination of the coding for the x direction and for the y direction. In this case, each pixel is divided into spatial sectors leading to channels A and B or to channels C and D, respectively. Maintaining the pattern with preferential direction as described in the one-dimensional case for the x and y directions, for the given array of microcells leading to channels A, B, C and D each pixel is divided into two spatial sectors that code as linearly as possible for A and B and for C and D, where the conditions change linearly in each spatial sector within the individual areas for A and B and within the areas for C and D.

In one embodiment, the microcells that lead to channel A or C, located within each pixel in the direction of the pixel $x_1$ or $y_1$ exclusively on the side of the pixel that is in the direction $x_1$ or $y_1$, and the microcells that lead to the channel B or D are located within each pixel in the direction of the pixel $x_N$ or $y_M$ exclusively on the side of the pixel that is in the direction $x_N$ or $y_M$, forming a dividing line. The pixel $x_1$ or $y_1$ can have only microcells that lead to channel A or C, respectively. The pixel $x_N$ or $y_M$ can only have microcells that lead to B or D, respectively. The transition of the distribution of the microcells for the channels A and B or C and D, however, can also be fluid, so there is no clear dividing line.

For all embodiments of linear coding in which a local weighting of the microcells within a pixel, respectively for the one-dimensional case and the two-dimensional case, is given according to the invention, a pixel may be divided into sectors, each realizing the local coding pattern of the pixel in which they are located. For example, a pixel can be subdivided into four equal-sized, preferably square sectors, each having the distribution pattern according to the invention. However, there may also be a different number of sectors, for example 2, 8 or 16, which are in one pixel and which each have the distribution pattern that leads to the linear coding.

If the pitch of the pixels corresponds to the distance of the microcells, then the ratio of the number of microcells connected to a channel changes linearly with the position on the sensor. The microcells should preferably be arranged so that the ratio of the microcells connected to the output channels $A_m$ and $B_m$ or $A_n$ and $B_n$, or A, B, C and D for an area arbitrarily illuminated with scintillation light, changes only with the position of the center of the illuminated area but not with the area size.

For the 1D coding in the x direction, this means that within a row the number of microcells connected to a channel $A_m$ decreases as linearly as possible as the x position progresses, and the microcells and those connected to a channel $B_m$ decrease as linearly as possible as the x position progresses.

For the 1D coding in the y direction, this means that within a row the number of microcells connected to a channel $A_n$ decreases as linearly as possible as the x position progresses, and the microcells and those connected to a channel $B_n$ are connected as linearly as possible as the x position progresses.

In a 2D coding, this means that each channel A, B, C and D is assigned a corner or side surface at which the microcells are preferably connected to the respective channels A, B, C and D. The number of microcells connected to the preferred channel of the relevant corner or side surface decreases linearly as one moves away from the preferred surface in the sensor.

The linear coding of the output channels with the xy position provides the first-order moment of the light distribution.

In order to determine the standard deviation of the light distribution and thus the depth of interaction, the second-order moment is additionally required. As a result, the parallax errors of the LOR are reduced or even completely eliminated according to the invention. In order to determine this, the sensor chip according to the invention includes an additional summing network and additional coder resistors, with which a coding that is as quadratic as possible is to be achieved. While the xy position coding can only be realized for individual pixels, the coding for the second-order moment can also be integrated into the sensor chip at subpixel resolution. This has the advantage that a more accurate calculation of the second-order moment can be achieved. If, however, the second-order moment is determined with the same high resolution as the first-order moment, calculation errors due to different levels of resolution of the moments are prevented, which is why a higher resolution should not always be achieved.

The possibilities of integrating the coder resistors and the summing network at the pixel level and at the subpixel level are presented below.

In all embodiments, the coder resistors $R_e$ can have resistance values between 10Ω and 1 kΩ, since they must be substantially smaller than the quenching and summing resistors.

1: Direct Tap of the Photocurrent after Merging in the Pixel

In one embodiment for the one-dimensional case, the photocurrents generated in the pixels provided for encoding at the output channels $A_m/A_n$ are merged and fed into a network $N_{S,nm,A}$ to which a coder resistor $R_{e,nm,A}$ is connected that leads to the channels $A_m/A_n$. From the network $N_{S,nm,A}$, a summing resistor $R_{S,nm,A}$ branches that leads to the network $N_S$. Analogously, the photocurrents generated in the pixels provided for encoding at the output channels $B_m/B_n$ are merged and fed into a network $N_{S,nm,B}$ to which a coder resistor $R_{e,nmB}$ is connected that leads to the channels $B_m/B_n$. From the network $N_{S,nm,B}$, a summing resistor $R_{S,nm,B}$ branches that in turn leads to the network $N_S$. In this embodiment, all networks and resistors are integrated into the chip and fewer coder resistors are required than in the following embodiments. Furthermore, this embodiment has the advantage that a strong photocurrent per pixel is obtained and the second-order moment is sampled with the same accuracy as the zero-order and first-order moments.

For this purpose, the microcells Z of a pixel that are provided in the one-dimensional case a) for connection to the channels $A_m/B_m$ or in the one-dimensional case b) for connection to the channels $A_n/B_n$ can be connected to a network $N_{S,nm,Am/An}$ or $N_{S,nm,Bm/Bn}$, where the network $N_{S,nm,Am/An}$ can be connected to a coder resistor $R_{e,nm,Am/An}$ and to a summing resistor $R_{S,nm,Am/An}$ and the network $N_{S,nm,Bm/Bn}$ can be connected to a coder resistor $R_{e,nm,Bm/Bn}$ and to a summing resistor $R_{S,nm,Bm/Bn}$.

In the two-dimensional case, the photocurrents that are generated in the pixels that are provided for encoding at the output channel A are also merged and fed into a network $N_{S,nm,A}$ to which a coder resistor $R_{e,nm,A}$ is connected that is connected to the channel A. From the network $N_{S,nm,A}$, a summing resistor $R_{S,nm,A}$ also branches that leads to the network $N_S$. Similarly, the photocurrents generated in the pixels provided for encoding at the output channel B are merged and fed into a network $N_{S,nm,B}$ to which a coder resistor $R_{e,nm,B}$ is connected that is connected to the channel B. From the network $N_{S,nm,B}$, a summing resistor $R_{S,nm,B}$ also branches, which in turn leads to the network $N_S$.

In addition, the photocurrents that are generated in the pixels and are provided for encoding at the output channels C and D for the y-axis are each fed into a network $N_{S,nm,C}$ and $N_{S,nm,D}$, to which a coder resistor $R_{e,nm,C}$ or $R_{e,nm,D}$ is connected that is connected to the channel C or D. The networks $N_{S,nm,C}$ or $N_{S,nm,D}$, in turn, each lead to the network $N_S$.

For this purpose the microcells Z, which are provided in the two-dimensional case c) for connection to the channels A, B, C and D, can be connected to a network $N_{S,nm,A}$, $N_{S,nm,B}$, $N_{S,nm,C}$ or $N_{S,nm,D}$, wherein the network $N_{S,nm,A}$ can be connected to a coder resistor $R_{e,nm,A}$ and a summing resistor $R_{S,nm,A}$, the network $N_{S,nm,B}$ to a coder resistor $R_{e,nm,B}$ and a summing resistor $R_{S,nm,B}$, the network $N_{S,nm,C}$ to a coder resistor $R_{e,nm,C}$ and a summing resistor $R_{S,nm,C}$, and the network $N_{S,nm,D}$ to a coder resistor $R_{e,nm,D}$ and a summing resistor $R_{S,nm,D}$.

In this case, all the coder resistors $R_e$ of a pixel have the same value both in the 1D and in the 2D case. This realization option is only applicable if the sensor is subdivided into pixels.

2: Tap of the Photocurrent after Partial Pooling of Microcells, e.g. Lines or Columns.

In a further embodiment, the photocurrents from at least two microcells whose photocurrents are to be connected to the same channel can be merged and introduced into the summing network. In this case, at least two microcells $Z_{ij}$ can be merged from at least one column and/or at least one row. A sensor chip in this embodiment consists off fields of interconnected microcells. For this purpose the outputs of the microcells $Z_{ij}$, consisting of a photodiode $D_{ij}$ and quench resistors $R_{q,ij}$, are linked together by a network $N_{S,nm,f}$ that leads to a coder resistor $R_{e,nm,f}$, which is delivered to the channels $A_m$ and $B_m$ or $A_n$ and $B_n$ or A, B, C and D. The network $N_{S,nm,f}$ also leads to a summing resistor $R_{S,nm,f}$, which leads into the network $N_S$. This embodiment leads to a very high level of detail accuracy of determination of the second-order moment. With this sensor chip the number of samples of the second-order moment can be increased by a factor of 10 to 160 compared with methods of SiPMs or photomultipliers or avalanche diodes not implemented in the sensor.

For this purpose at least two microcells $Z_{ij}$ of a row l and/or a column k can be combined by lines to form in each case at least one field f connected to a network $N_{S,f}$, where at least one network $N_{S,f}$ is connected to a coder resistor $R_{e,f}$ and a summing $R_{S,f}$, with each coder resistor $R_{e,f}$ connected to the channels $A_m$ and $B_m$ or $A_n$ and $B_n$ or A, B, C and D.

This method is particularly well-suited if a subdivision into pixels of the sensor chip is not present.

3. Tap after Each Microcell

In a further embodiment, the outputs of individual microcells $Z_{i,j}$ consisting of a photodiode $D_{ij}$ and quench resistors $R_{q,ij}$ are each fed via a network $N_{s,ij}$ to a coder resistor $R_{e,ij}$ connected to the channels $A_m$ or $B_m$ and $A_n$ or $B_n$ or A, B, C or D. Furthermore, the outputs of the individual microcells $Z_{ij}$ are each fed into the network $N_S$ via a summing resistor $R_{S,ij}$. This embodiment leads to the highest level of detail of determination of the second-order moment. With this sensor chip the number of samples of the second-order moment can be increased by a factor of up to 320 compared with methods of SiPMs or photomultipliers or avalanche diodes not implemented in the sensors.

For this purpose the outputs of individual microcells $Z_{ij}$ can each be connected to a network $N_{S,ij}$ that is connected to a coder resistor $R_{e,ij}$ and a summing resistor $R_{S,ij}$, each coder resistor $R_{e,ij}$ being connected to the channels $A_m$ or $B_m$, or $A_n$ or $B_n$, or A, B, C or D.

This method is particularly well-suited if a subdivision into pixels of the sensor chip is not present.

It is also possible to combine two or three of the illustrated alternatives. For instance, possibility 1 can be combined with 2, possibility 1 with 3, possibility 2 with 3 or possibilities 1, 2 and 3.

The resistance values for the summing resistors $R_S$ are the same in all embodiments within the summing network O and may be between 1 kΩ to 100 kΩ. The summing resistors $R_{S,nm,Am}$, $R_{S,nm,Bm}$, $R_{S,nm,An}$ and $R_{S,nm,Bn}$ or $R_{S,nm,A}$, $R_{S,nm,B}$, $R_{S,nm,C}$ and $R_{S,nm,D}$ must be large enough that the generated photocurrent is not significantly affected by the SiPM diodes. The summing resistors $R_{S,nm,Am}$, $R_{S,nm,Bm}$, $R_{S,nm,An}$, $R_{S,nm,Bn}$, or $R_{S,nm,A}$, $R_{S,nm,B}$, $R_{S,nm,C}$ and $R_{S,nm,D}$ are merged via the network $N_S$. Thus, the signals are added up.

The summing network consists of the summing resistors described above and requires the coder resistors also described, which are integrated into the photon current paths as described. After the voltage is tapped via the summing resistors, all signals in the network $N_S$ are merged. The accumulated signal is used to calculate the second-order moment needed. The standard deviation of the light distribution also requires the first-order moment. The first-order moment is supplied from the output channels $A_m$ and $B_m$ or $A_n$ and $B_n$ or A, B, C and D. The accumulated signal of the network $N_S$ can be connected directly to the output channel E. A summing network O is preferred, which includes an operational amplifier OP that is grounded and has a negative feedback with a resistor $R_{S,h}$. This has the advantage that the gain of the signal of the output channel E can be set via the ratio of $R_S$/summing resistor variable.

The summing network O may be integrated into the sensor chip, or parts of it may be located less preferably outside the sensor chip. If the entire summing network O is located outside the sensor chip the result is that all networks leading to the summing resistors are led out of the sensor chip, leading to a very high number of output channels. If the summing resistors are integrated in the sensor chip only the network $N_S$ must be led out of the sensor chip, which can be realized with an output channel. However, to save space and reduce noise it is preferable to integrate the entire summing network O into the chip. The summing network O may include an operational amplifier, which is preferably also integrated in the SiPM sensor chip.

The coder resistors $R_e$ determine the voltage that is tapped via the summing resistors $R_S$. At the same time, the coder resistors $R_e$ may not lead to photocurrent losses and change the quenching behavior, which is why they must be at least 10 times, or better 100 times or more, smaller than the quench resistors $R_q$ and the summing resistors $R_S$. In order to be able to select the summing resistor variable high enough, preferably one operational amplifier OP is used that amplifies the signal of the network $N_S$ that is reduced by the higher summing resistors $R_S$.

To obtain the second-order moment a maximum possible square voltage distribution is set, tapped via the summing resistors $R_S$, through the coder resistors $R_e$.

In a two-dimensional distribution function, there must be a quadratic distribution in both the x or u and y or v directions. To achieve this, the coder resistor values are preferably set as exactly quadratic as possible over the xy or uv surface of the sensor. The following equation describes the distribution function p(x,y) of the coder resistors $R_e$, where the same holds for a distribution function p(u,v):

$$p(x,y)=(x-\beta_1)^{(2w1)^{\alpha_1}}(y-\beta_2)^{(2w2)^{\alpha_2}}$$

$$\beta_1,\beta_2=const.\in[0,\infty)$$

$$\omega_1,\omega_2=1,2,3\ldots$$

$$0.5<\alpha_1,\alpha_2<1.5 \qquad \text{(Formula 8)}$$

In addition, it is possible to quadratically distribute the preferably maximum quadratic distribution only in either an x or u or in a y or v direction. This is due to the rotational symmetry of the light distribution in the single crystal. In the case of coding in the x or u direction, all pixels of the sensor or microcell fields for individually encoded microcells with the same x or u position have the same coder resistor value. The coder resistor value only changes when the x or u position is changed. In the case of a coding in the y or v direction, all pixels of the sensor or microcell fields for individually encoded microcells with the same y or v position have the same coder resistor value. The coder resistor value changes only with a change of the y or v position. In the case of a coding in only one direction, formula 8 simplifies to the following equation for the distribution function p(x) and p(y) or p(u) and p(v) of the coder resistors $R_e$:

$$p(x)(x)=(x-\beta_1)^{(2w1)^{\alpha_1}}$$

$$p(y)=(y-\beta_2)^{(2w2)^{\alpha_2}}$$

$\beta_1, \beta_2 = \text{const.} \in [0, \infty)$ $\omega_1, \omega_2 = 1, 2, 3 \ldots$ $0.5 < \alpha_1, \alpha_2 < 1.5$ \hfill (Formula 9)

In addition, it is also possible according to formula 9 to encode the coder resistors and thereby encode both in the x or u and in the y or v direction. For this purpose the microcells of the sensor are divided with their coder resistors into two, preferably equal sets, which are summed through summing resistors $R_S$ via networks $N_{S,x}$ and $N_{S,y}$ instead of with a common summing network O, in each case with the aid of two summing networks $O_x$ and $O_y$. The two quantities of microcells should preferably be distributed as evenly as possible over the entire sensor surface. In a non-limiting manner, this results in preferred forms of implementation for the three possibilities of integrating the coder resistors.

In case 1 "direct tap of the photocurrent after merging in the pixel," the microcells of a pixel connected to the same output channel can each be divided into two sets and coded with their own coder resistors and connected to the respective networks, $N_{S,x}$ or $N_{S,y}$. In the case of a 2D coding the microcells are already divided into two sets, which are connected to channels A and B as well as C and D. Therefore, the coding resistors $R_{e,nm,A}$ and $R_{e,nm,B}$ can be used for the first direction and $R_{e,nm,C}$ and $R_{e,nm,D}$ for the second direction.

In case 2 "tap the photocurrent after partial combination of microcells" it is possible either to divide the fields f and divide them into the two summing networks or to divide the microcells of a field into the two sets and thus integrate two coder and summing resistors per field into the chip.

In case 3 "tap after each microcell," the microcells are divided into two sets and preferably integrated alternately into the two networks.

The illustrated functions are implemented in the sensor chips according to the invention at least partially, but preferably completely. For this purpose the semiconductor processing techniques known to those skilled in the art, such as the C-MOS method, or special SiPM production methods such as RGB-SiPM, RSB-HD-SiPM, NUV-SiPM or RGB-HD, can be used. In particular, the integration of the summing network O into the sensor chip has the advantage that, besides the space savings, signal interference is minimized and the signal-to-noise ratio is optimized.

The sensor chips according to the invention can be arranged in a grid so as to form a block a×b. Here, the linear position codings and quadratic coding of the potentials extend sensor-spanning across a plurality of sensor chips in the directions a and b.

It is equally possible to divide a single sensor chip into G blocks of arbitrary xy size, where g=1, . . . G. In this case the position coding, the potential coding, and the summing network each extend only over a single block of the sensor chip G. A block is constructed in the same way as a sensor chip. The sensor chip includes in the embodiment with G blocks output channels $A_m$ and $B_m$ or $A_n$ and $B_n$ or A, B, C and D for each block g. This embodiment has the advantage that a plurality of blocks can be integrated into a sensor chip without resulting in additional non-photosensitive gaps between the blocks.

FIG. 1 shows a sensor chip coded one-dimensionally in the x direction. The coding is realized by a numerical and local distribution of microcells that end in the channels A and B. The sensor chip has 4×4 pixels, which in this example have a square shape and their demarcation is made visible by thick lines. On the right side of the figure are designated the output channels A1, A2, A3 and A4 in which the signals of the microcells end, which extend along the x-axis from the microcells arranged along the x direction on the side nearer the pixel position $x_1$. The local areas of the pixels leading to the channels A1, A2, A3 and A4 are hatched from bottom left to top right according to the boxes shown on the right side of the figure. The local areas of the pixels leading to the channels B1, B2, B3 and B4 are hatched from top left to bottom right according to the boxes shown on the right side of the figure.

It can be seen that the microcells in all pixels with x position $x_1$ lead to 100% signals to the outputs A1, A2, A3 and A4. The microcells of the pixels with position $x_4$ lead to 100% signals into the outputs B1, B2, B3 and B4. In the intervening pixels $x_2$ and $x_3$, the areas leading to the channels A1, A2, A3 and A4 or B1, B2, B3 and B4 are locally divided according to their numerical weighting, resulting in the linear coding. In turn, in these pixels, the surface portions of the pixels that end in the channels A1, A2, A3 and A4 are on the side of the sensor chip nearer the position $x_1$ and the surface elements that end in the channels B1, B2, B3 and B4 are on the side of the sensor chip nearer the position $x_4$.

Figure 2:
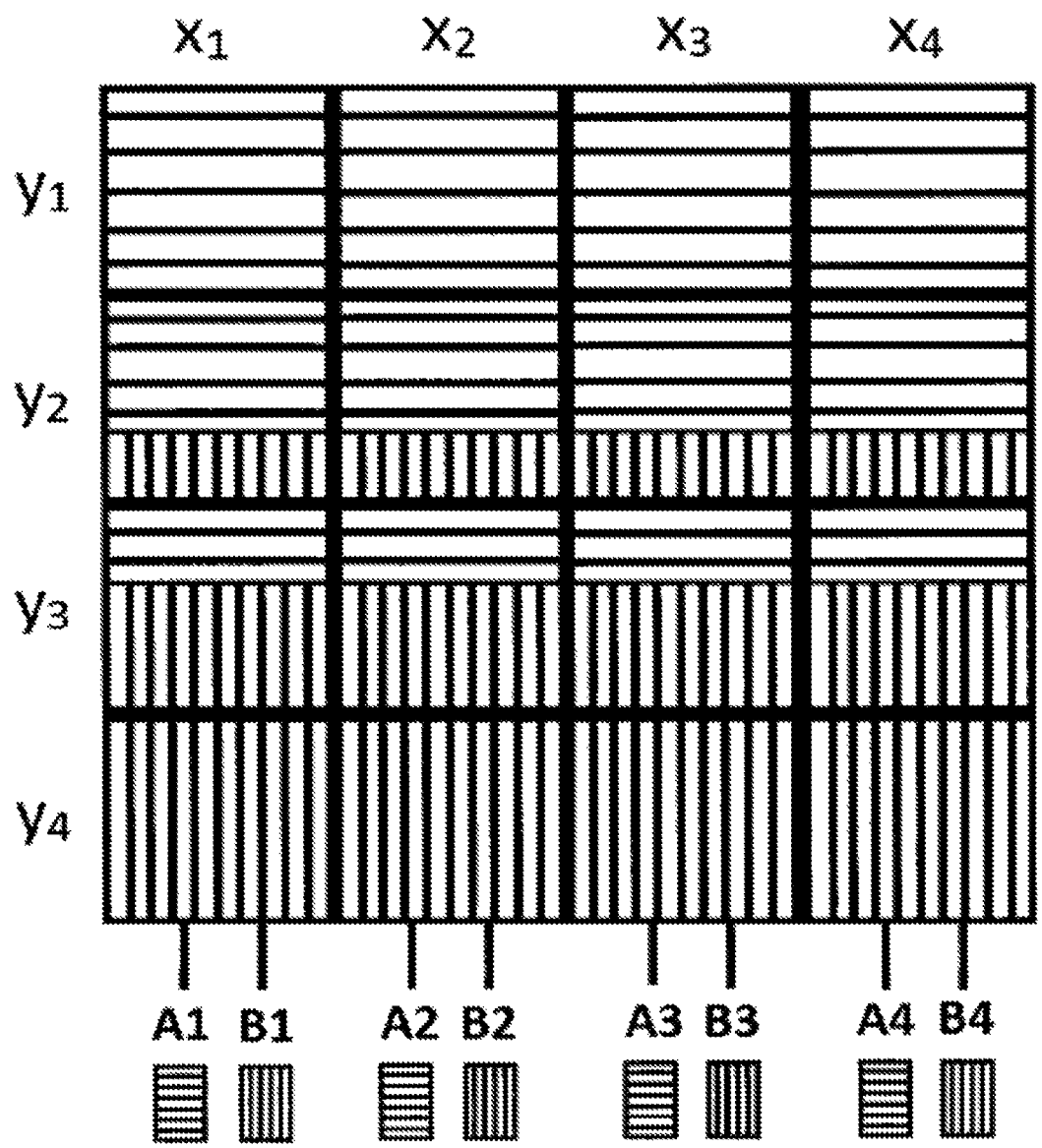
FIG. 2 illustrates a sensor chip coded one-dimensionally in the y direction.

FIG. 2 shows a sensor chip that is coded one-dimensionally in the y direction. The coding is realized by a numerical and local distribution of microcells ending in the channels A and B. The sensor chip has 4×4 pixels, which in this example have a square shape and their demarcation is made visible by thick lines. On the lower side of the figure, the output channels A1, A2, A3 and A4 are designated in which the signals of the microcells end, which extend along the y-axis from the microcells arranged along the y direction on the side nearer the pixels with the position $y_1$. The local areas of the pixels leading into the channels A1, A2, A3 and A4 are horizontally hatched according to the boxes shown on the lower side of the figure. The local areas of the pixels leading into the channels B1, B2, B3 and B4 are vertically hatched according to the boxes shown on the lower side of the figure. It can be seen that the microcells of all pixels with position $y_1$ lead to 100% signals to the outputs A1, A2, A3 and A4. The microcells of all pixels with position $y_4$ give 100% signals to the outputs B1, B2, B3 and B4. In the intervening pixels $y_2$ and $y_3$, the areas that lead to the channels A1, A2, A3 and A4 or B1, B2, B3 and B4 are correspondingly locally divided according to their numerical weighting, resulting in the linear coding. In turn, in these pixels, the surface portions of the pixels that end in the channels A1, A2, A3 and A4 are on the side of the sensor chip nearer the position $y_1$ and the surface elements that end in the channels B1, B2, B3 and B4 are on the side of the sensor chip nearer the position $y_4$.

Figure 3:
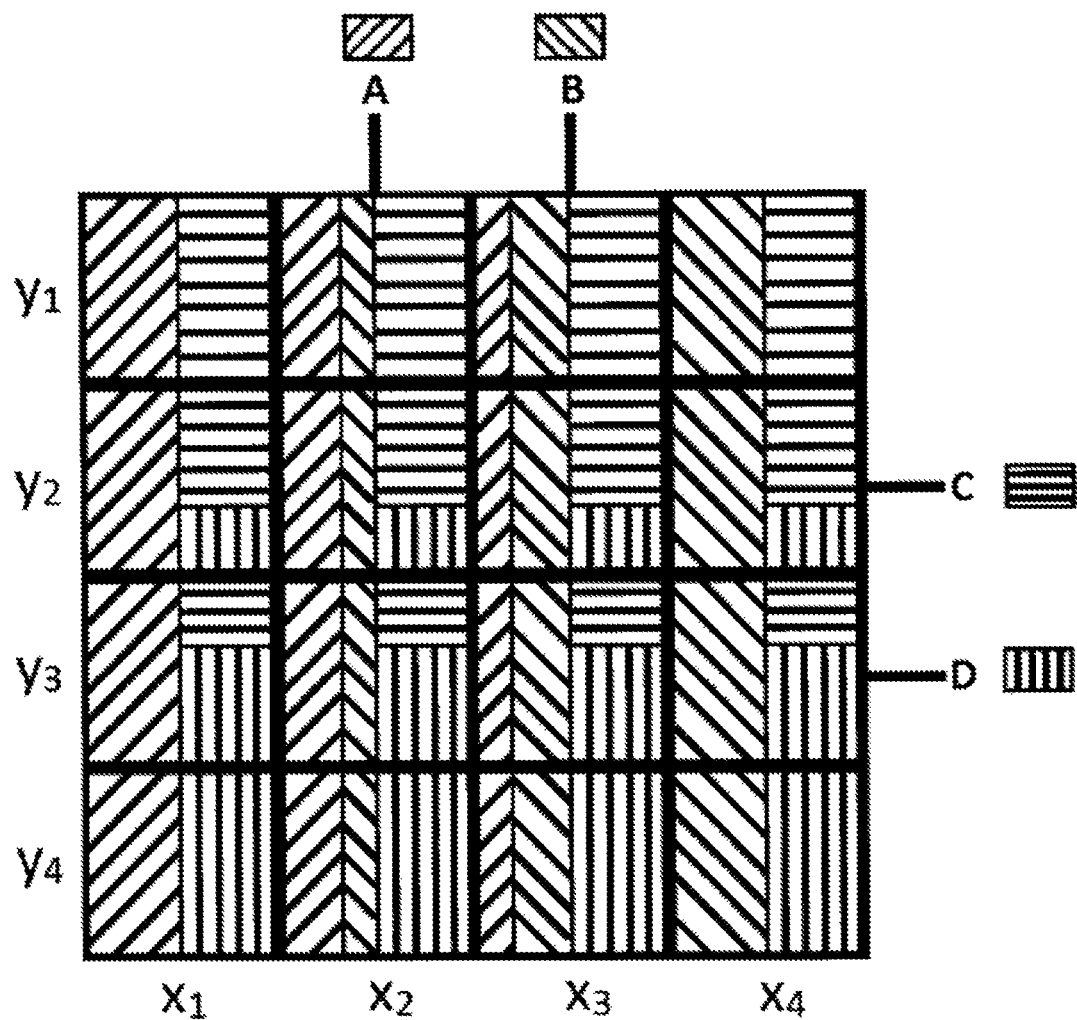
FIG. 3 illustrates a sensor chip coded two-dimensionally in the x and y directions.

FIG. 3 shows a sensor chip that is coded two-dimensionally in the xy direction. The coding is realized by a numerical and spatial distribution of microcells ending in the channels A, B, C and D. The sensor chip has 4×4 pixels, which in this example have a square shape and their demarcation is made visible by thick lines. Each pixel is divided centrally with respect to the x direction, with the left half coded for the x direction and the right half coded for the y direction. On the upper side of the figure, the output channels A and B are designated in which the signals of the microcells end that come from the microcells along the x-axis. The signals of the microcells arranged along the x direction on the side nearer the pixels with the position $x_1$ end in channel A, and the signals of the microcells arranged on the side nearer the pixels with position $x_4$ end in channel B. The local areas of the pixels leading to channel A are hatched from bottom left to top right according to the boxes shown on the upper side of the figure. The local regions of the pixels leading to channel B are hatched from top left to bottom right according to the boxes shown on the upper side of the figure. It can be seen that the microcells in positions $(x_1, y_1)$, $(x_1, y_2)$, $(x_1, y_3)$ and $(x_1, y_4)$ send 50% signals to the output A. The microcells in x position $x_4$ for the y positions $y_1$, $y_2$, $y_3$ and $y_4$ send 50% signals to the channel B. In the intervening pixels, the areas of the pixels of the x positions $x_2$ and $x_3$ are locally divided for they positions $y_1$, $y_2$, $y_3$ and $y_4$ according to their numerical weighting, which results in linear coding. In turn, in these pixels, the area proportions of the left half of the pixels of the x positions $x_2$ and $x_3$, in each case for they positions $y_1$, $y_2$, $y_3$ and $y_4$ that end in the channel A, are on the side of the sensor chip nearer the position $x_1$. The area proportions of the left half of the pixels of x positions $x_2$ and $x_3$, in each case for they positions $y_1$, $y_2$, $y_3$ and $y_4$ that end in channel B, are on the side of the sensor chip nearer the position $x_4$.

On the right side of the figure are designated the output channels C and D in which the signals of the microcells end, which extend along they axis from the microcells. The signals of the microcells arranged along the y direction on the side nearer the pixels with the position $y_1$ end in channel C, and the signals of the microcells on the side nearer the pixels with the position y4 end in channel D. The local areas of the pixels leading to channel C are horizontally hatched according to the boxes on the right side of the figure. The local areas of the pixels leading to channel D are vertically hatched according to the boxes on the right side of the figure. It can be seen that the microcells in they position $y_1$ emit 50% signals to the output C for the x positions $x_1$, $x_2$, $x_3$ and $x_4$, respectively. The microcells in the y position $y_4$ emit 50% signals to the channel D for the x positions $x_1$, $x_2$, $x_3$ and $x_4$, respectively. In the intervening pixels, the areas of the pixels of they positions $y_2$ and $y_3$ are locally distributed according to their numerical weighting, which results in linear coding. In turn, in these pixels, the area proportions of the right half of the pixels with they positions $y_2$ and $y_3$, in each case for the x positions $x_1$, $x_2$, $x_3$ and $x_4$ that end in the channel C, are on the side of the sensor chip nearer the position $y_1$. The area proportions of the right half of the pixels with the y positions $y_2$ and $y_3$, in each case for the x positions $x_1$, $x_2$, $x_3$ and $x_4$ that end in the channel D, are on the side of the sensor chip nearer the position $y_4$.

Figure 4:
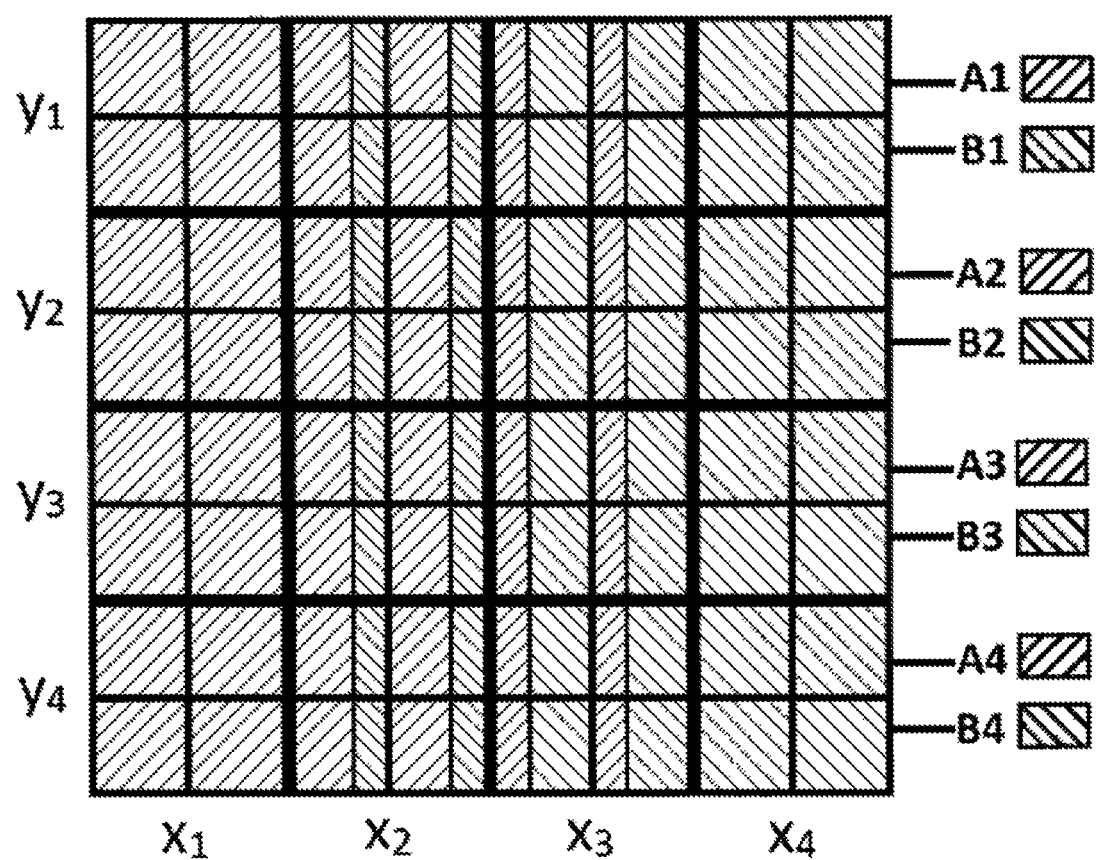
FIG. 4 illustrates a sensor chip coded one-dimensionally in the x direction.

FIG. 4 shows a further embodiment of a sensor chip that is coded one-dimensionally in the x direction, the coding being given by a numerical distribution and local distribution of microcells that lead to the channels A1, A2, A3 and A4 as well as B1, B2, B3 and B4. The symbolism and nomenclature are identical to the designations in FIG. 1 However, in FIG. 4 the individual pixels are divided into four further square sectors, each occupying the same square areas and shown separated from one another by lines of medium thickness. Within all pixels with the x positions $x_1$ and $x_4$, the microcells of all sectors lead to the channels A1 to A4 for $x_1$ and to the channels B1 to B4 for $x_4$. For the pixels with the x positions $x_2$ and $x_3$, in accordance with the coding of the hatching there results a division in which the microcells associated with the channels A1 to A4 are arranged on the side nearer the position $x_1$ and the microcells associated with the channels B1 to B4 are arranged on the side nearer the position $x_4$, but with the proviso that this pattern repeats within a pixel so it exists four times per pixel.

Figure 5:
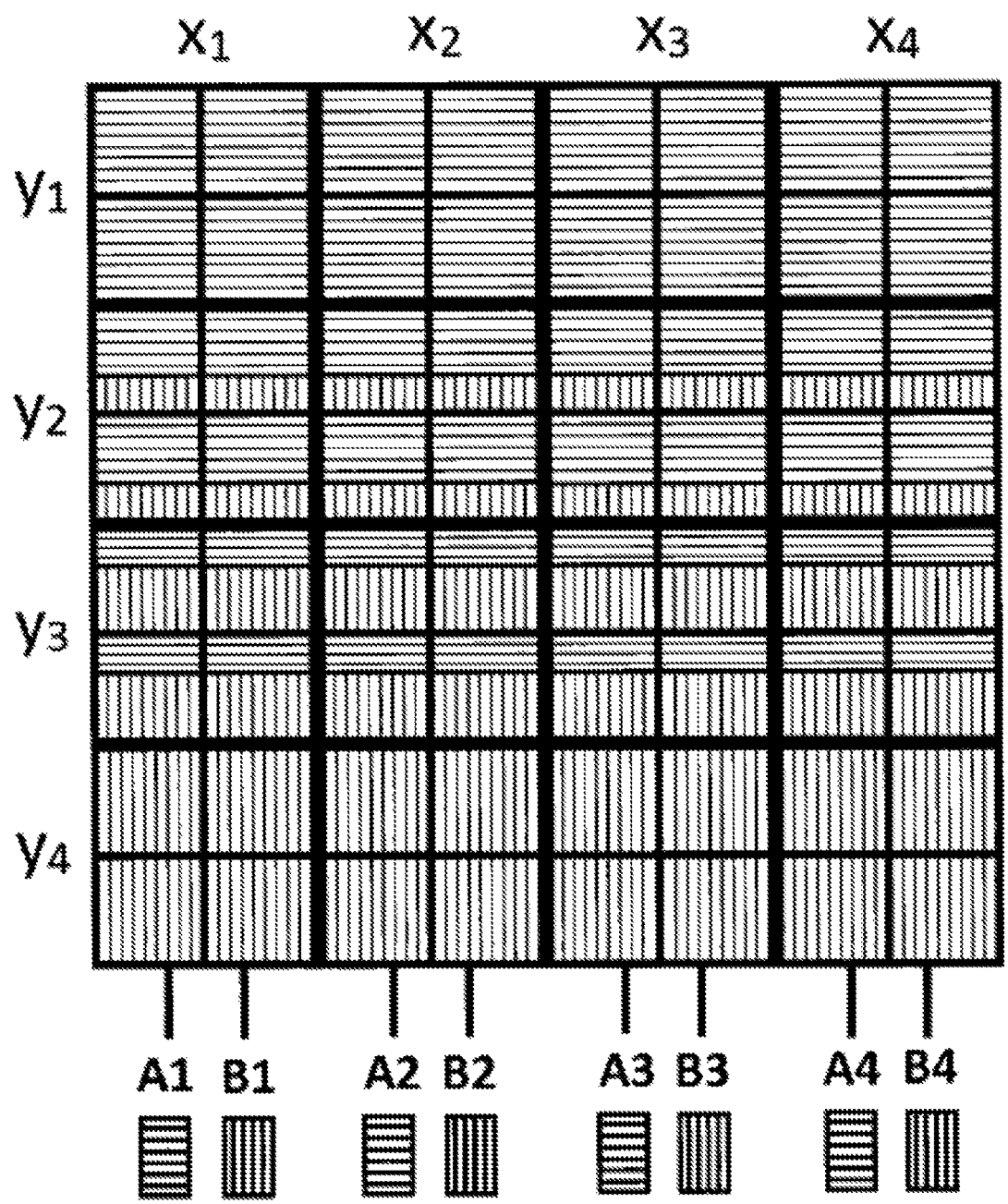
FIG. 5 illustrates a sensor chip coded one-dimensionally in the y direction.

FIG. 5 shows a further embodiment of a sensor chip that is coded one-dimensionally in the y direction, the coding being given by a numerical distribution and local distribution of microcells that lead to the channels A1, A2, A3 and A4 as well as B1, B2, B3 and B4. The symbolism and nomenclature are identical to the designations in FIG. 2. However, in FIG. 5 the individual pixels are still divided into four further square sectors, each occupying the same areas and shown separated from one another by lines of medium thickness. Within all pixels with they positions $y_1$ and $y_4$, the microcells of all sectors lead to the channels A1 to A4 for y positions $y_1$ and to channels B1 to B4 for y positions y4. For all pixels with y positions $y_2$ and $y_3$, in accordance with the coding of the hatching there results a division in which the microcells associated with the channels A1 to A4 are on the side nearer they position $y_1$ for the x positions $x_1$, $x_2$, $x_3$ and $x_4$, respectively and the microcells associated with the channels B1 to B4 are arranged the side nearer the y position $y_4$ for the x positions $x_1$, $x_2$, $x_3$ and $x_4$, respectively but with the proviso that this pattern is repeated within a pixel so it exists four times per pixel.

Figure 6:
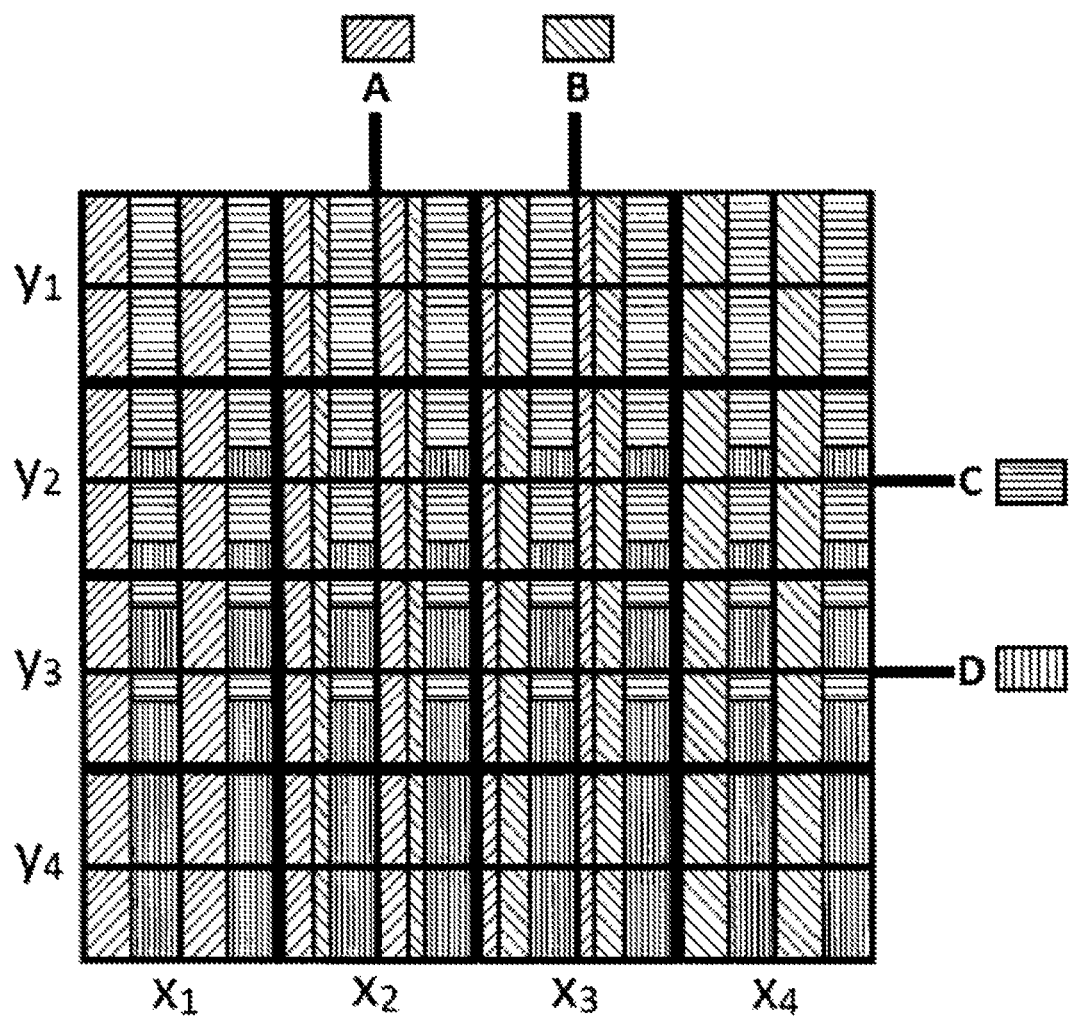
FIG. 6 illustrates a sensor chip coded two-dimensionally in the xy direction.

FIG. 6 shows a further embodiment of a sensor chip coded two-dimensionally in the xy direction, the coding being given by a numerical distribution and local distribution of microcells leading to the channels A, B, C and D. The symbolism and nomenclature are identical to the designations in FIG. 3. The embodiment in FIG. 6 differs from the embodiment in FIG. 3 by each pixel being subdivided into four equal square sectors, in which the respective coding patterns of the distribution of the microcells are realized in a pixel that ends in the channels A, B, C and D so that the coding pattern is present four times within a pixel.

On the upper side of the figure are designated the output channels A and B in which the signals of the microcells end, which extend along the x-axis from the microcells. The signals of the microcells end in channel A in each sector of a pixel arranged along the x direction on the side nearer the pixels with the position $x_1$, and the signals of the microcells end in channel B in each sector of a pixel arranged on the side nearer the pixels with position $x_4$.

The local areas of the pixels leading to channel A are hatched from bottom left to top right according to the boxes shown on the upper side of the figure. The local regions of the pixels leading to channel B are hatched from top left to bottom right according to the boxes shown on the upper side of the figure. It can be seen that the microcells of the sectors of a pixel with the x position $x_1$ emit 50% signals to the output A. The microcells of the sectors of a pixel with the x position $x_4$ emit 50% signals to the channel B. In the intervening pixels, the areas of the sectors of all pixels with the x positions $x_2$ and $x_3$ are correspondingly locally divided according to their numerical weighting, resulting in the linear coding. In turn, in these pixels, the area proportions of the left half of the sectors of the pixels with the x positions $x_2$ and $x_3$ that end in the channel A are located on the side of the sensor chip nearer the position $x_1$. The area proportions of the right half of the sectors of the pixels with x positions $x_2$ and $x_3$ that end in channel B are located on the side of the sensor chip nearer position $x_4$.

On the right side of the figure are designated the output channels C and D, in which the signals of the microcells end, which extend along the y-axis from the microcells. The signals of the microcells end in channel C in each sector of a pixel arranged along the y direction on the side nearer the pixels with the position $y_1$, and the signals of the microcells end in channel D in each sector of a pixel arranged on the side nearer the pixels with the position $y_4$.

The local regions of the pixels leading to channel C are horizontally hatched according to the boxes on the right side of the figure. The local areas of the pixels leading to channel D are vertically hatched according to the boxes on the right side of the figure. It can be seen that the microcells of the sectors of all pixels with they position $y_1$ emit 50% signals to the output C. The microcells of the sectors of all the pixels with the position y4 emit 50% signals to the channel D. In the intervening pixels the areas of the sectors of all pixels with the y positions $y_2$ and $y_3$ are correspondingly locally divided according to their numerical weighting, resulting in the linear coding. In turn, the surface portions of the upper half of the sectors of the pixels with they positions $y_2$ and $y_3$ that end in the channel C are located on the side of the sensor chip nearer the position $y_1$. The area proportions of the lower half of the sectors of the pixels with they positions $y_2$ and $y_3$ that end in the channel D are located on the side of the sensor chip nearer the position $y_4$.

Figure 7:
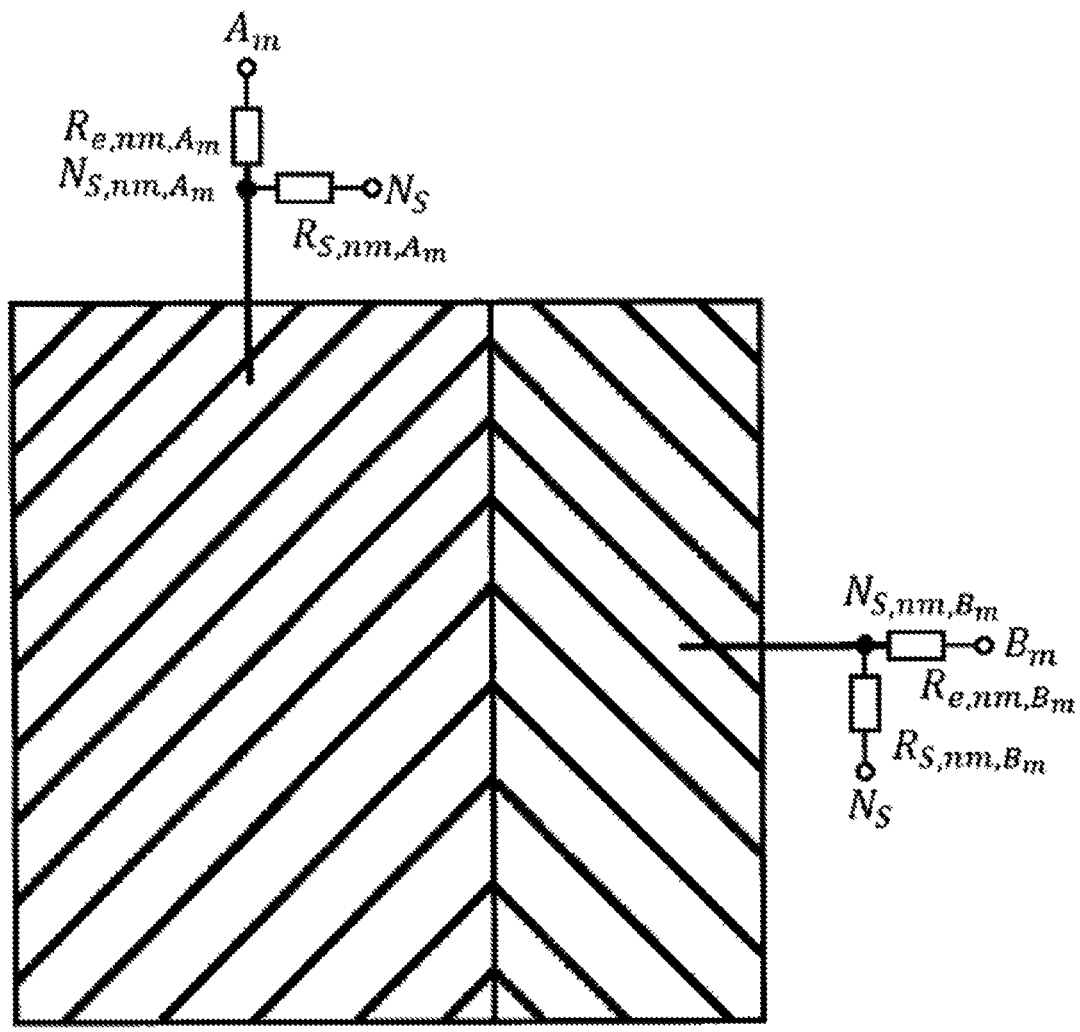
FIG. 7 illustrates a pixel with a one-dimensional coding in the x direction.

FIG. 7 shows a pixel that codes one-dimensionally in the x direction. The symbolism for the hatchings and their association with the channels A and B are the same as in FIG. 1. In this embodiment according to no. 1, "direct tap of the photocurrent after merging in the pixel," the photocurrent of the microcells located closer to the $x_1$ position is fed to a network $N_{S,nm,Am}$ that is fed to a coder resistor $R_{e,nm,Am}$ and ends in the channel $A_m$. Connected to the network $N_{S,nm,Am}$ is a summing resistor $R_{S,nm,Am}$ that leads to a network $N_S$. Similarly, the photocurrent of the microcells located closer to the $x_N$ position is fed to a network $N_{S,nm,Bm}$ that leads to a coder resistor $R_{e,nm,Bm}$ and ends in the channel $B_m$. Connected to the network $N_{S,nm,Bm}$ is a summing resistor $R_{S,nm,Bm}$ that also leads to the network $N_S$.

Figure 8:
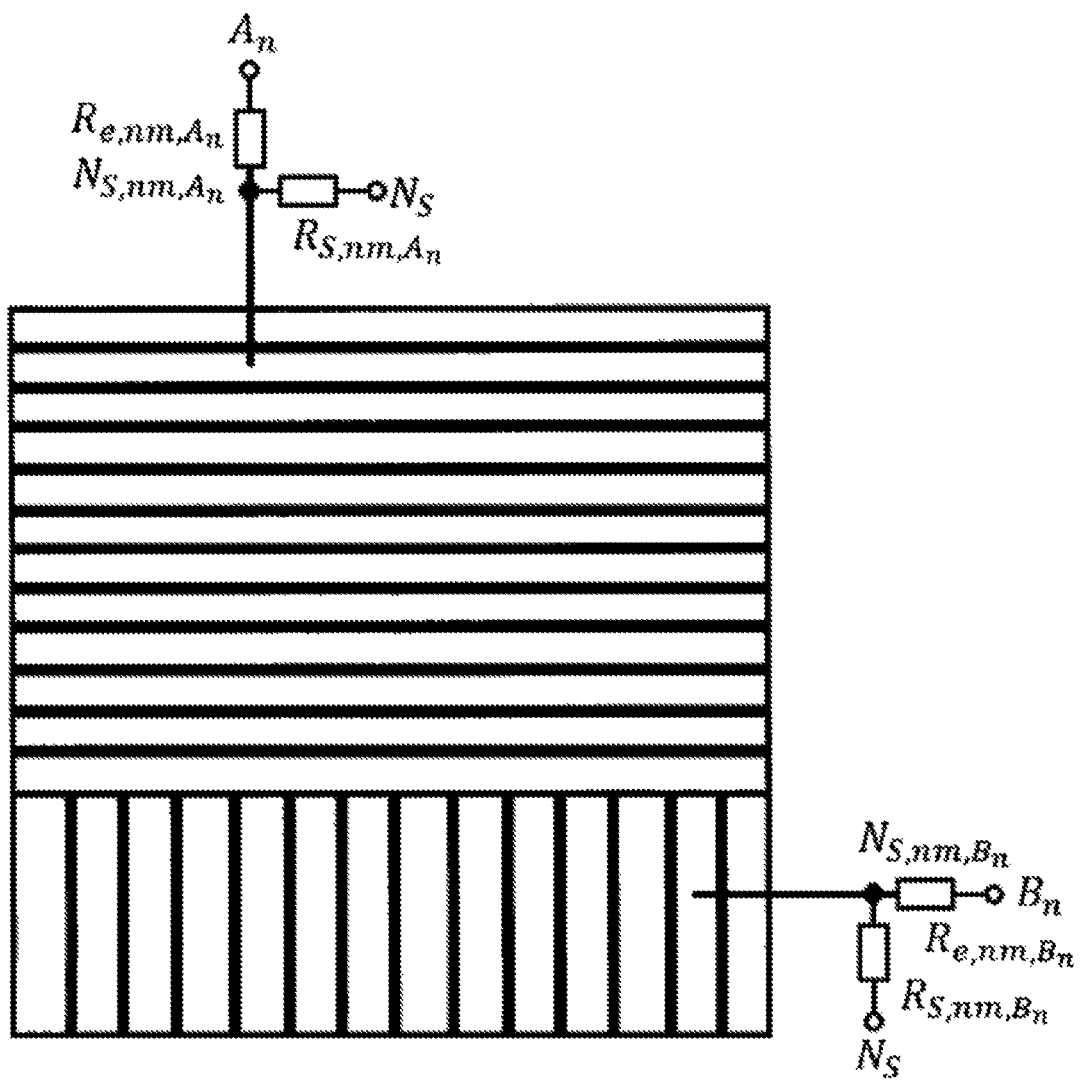
FIG. 8 illustrates a pixel with a one-dimensional y coding.

FIG. 8 shows a pixel that codes one-dimensionally in the y direction. The symbolism for the hatchings and their association with the channels A and B are the same as in FIG. 2. In this embodiment according to No. 1, "direct tap of the photocurrent after merging in the pixel," the photocurrent of the microcells located closer to the $y_1$ position is fed to a network $N_{S,nm,An}$ that leads to a coder resistor $R_{e,nm,An}$ and ends in the channel $A_n$. Connected to the network $N_{S,nm,An}$ is a summing resistor $R_{S,nm,An}$ that leads to a network $N_S$. Similarly, the photocurrent of the microcells located closer to the $y_M$ position is fed to a network $N_{S,nm,Bn}$ that leads to a coder resistor $R_{S,nm,Bn}$ and ends in channel $B_m$. Connected to the network $N_{S,nm,Bn}$ is a summing resistor $R_{S,nm,Bn}$ that also leads to the network $N_S$.

Figure 9:
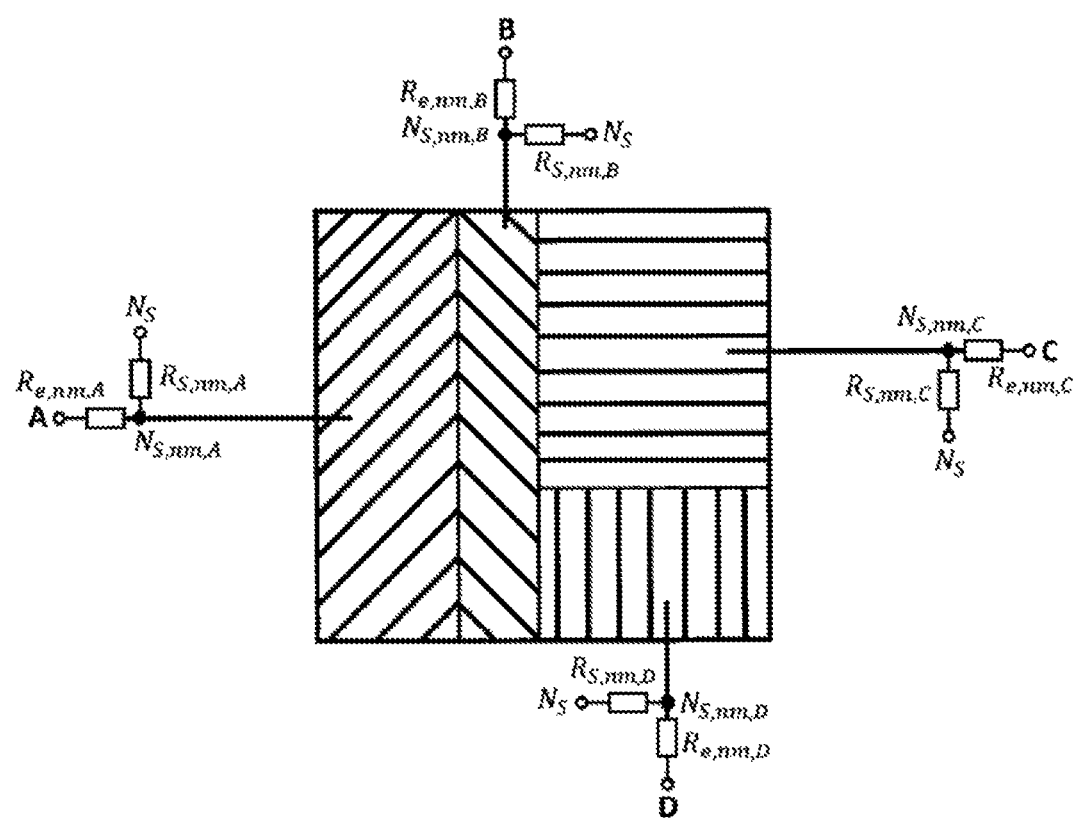
FIG. 9 illustrates a pixel with a two-dimensional xy coding.

FIG. 9 shows a pixel that codes two-dimensionally in the xy direction. The pixel is split in half relative to the x direction, the left half coding for the x direction. The right half codes for the y direction.

The symbolism for the hatchings and their association with the channels A, B, C and D are the same as in FIG. 3. In this embodiment according to No. 1, "direct tap of the photocurrent after merging in the pixel," the photocurrent of the microcells located in the left half of the pixel closer to the left outer side of the pixel is fed to a network $N_{S,nm,A}$ that leads to a coder resistor $R_{e,nm,A}$ and ends in the channel A. Connected to the network $N_{S,nm,A}$ is a summing resistor $R_{S,nm,A}$ that leads to a network $N_S$. Similarly, the photocurrent of the microcells located in the left half of the pixel closer to the right outer side of the pixel is fed to a network $N_{S,nm,B}$ that leads to a coder resistor $R_{e,nm,B}$ and ends in the channel B. Connected to the network $N_{S,nm,B}$ is a summing resistor $R_{S,nm,B}$ that also leads to the network $N_S$.

In the y direction, the photocurrent of the microcells located in the right half of the pixel closer to the top outer side of the pixel is fed to a network $N_{S,nm,C}$ that leads to a coder resistor $R_{e,nm,C}$ and ends in the channel C. Connected to the network $N_{S,nm,C}$ is a summing resistor $R_{S,nm,C}$ that leads to the network $N_S$. Analogously, the photocurrent of the microcells located in the right half of the pixel closer to the lower outer side of the pixel is fed to a network $N_{S,nm,D}$ that leads to a coder resistor $R_{e,nm,D}$ and ends in the channel D. Connected to the network $N_{S,nm,D}$ is a summing resistor $R_{S,nm,D}$ that also leads to the network $N_S$.

Figure 10:
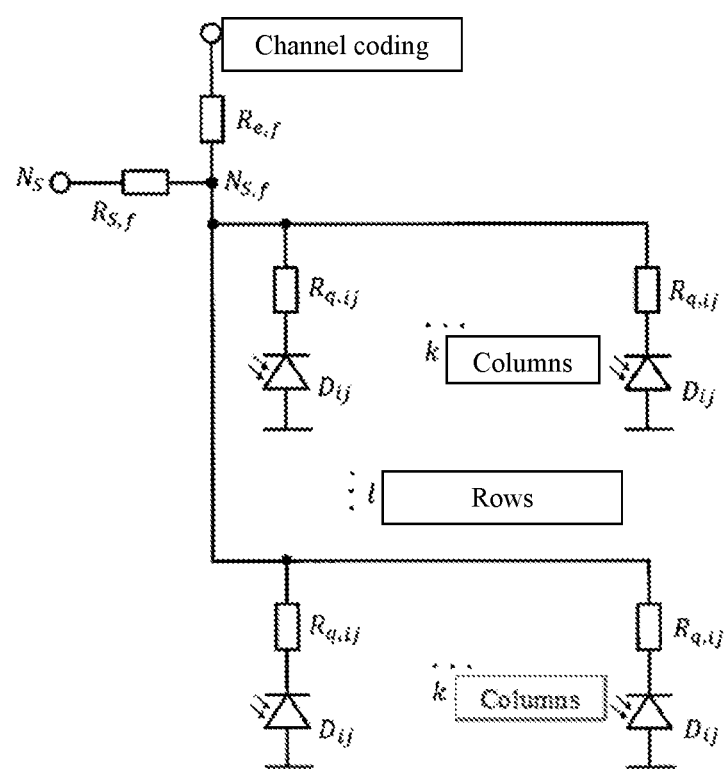
FIG. 10 illustrates microcells merged into a summing network.

FIG. 10 shows an embodiment according to No. 2, according to which the tap of the photocurrent takes place after a partial combination of microcells. Here the outputs of groups of microcells, consisting of a photodiode $D_{ij}$ and a respectively associated quench resistor $R_{q,ij}$, are merged through a network $N_{S,f}$, which is connected to a coder resistor $R_{e,f}$. Via the coder resistor $R_{e,f}$ the signal is forwarded to channel coding and connected to the output channels by means of the linear coding described above. Connected to the network $N_{S,f}$ is another summing resistor $R_{S,f}$ that is connected to the network $N_S$.

Figure 11:
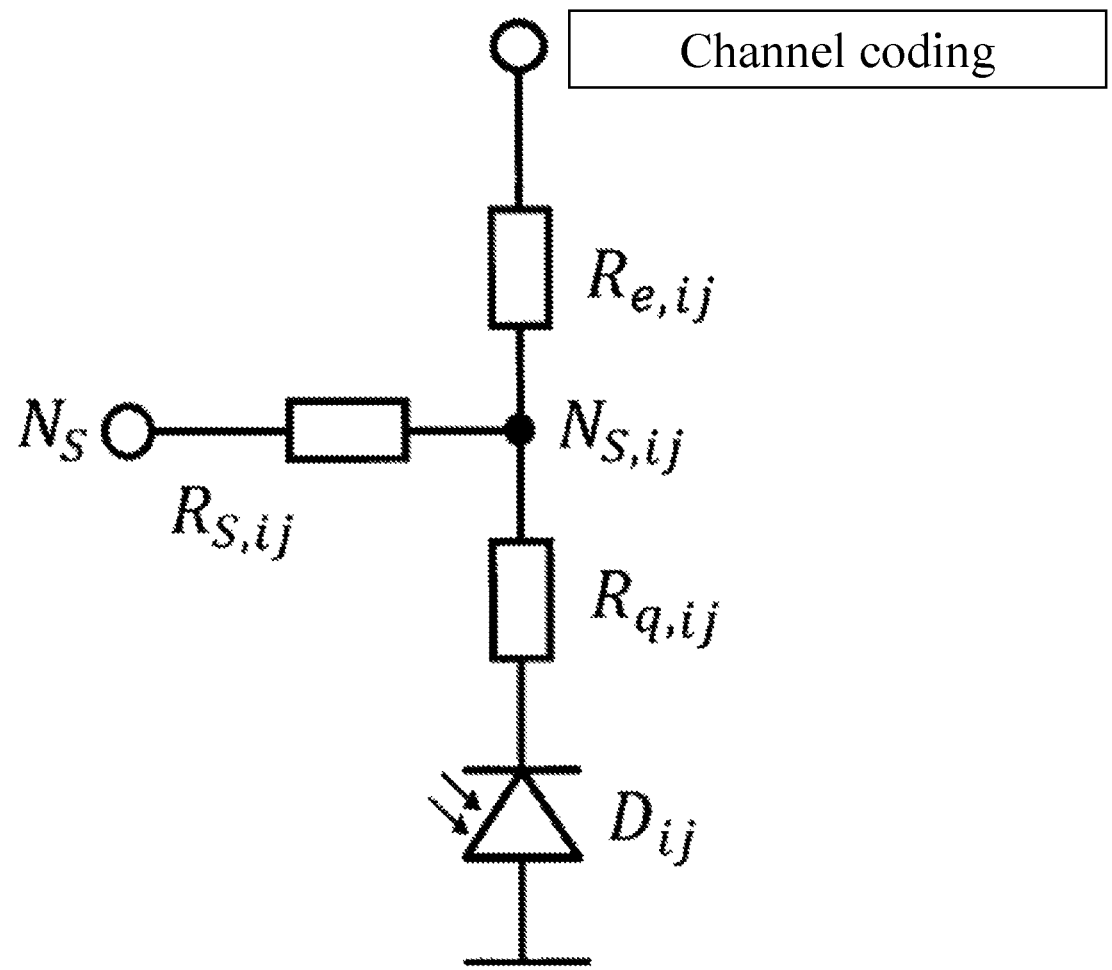
FIG. 11 illustrates a microcell that ends in a summing network and in a channel coding.

FIG. 11 shows an embodiment according to No. 3, according to which a tap of the photocurrent takes place after each microcell. In this case, a microcell consisting of a photodiode $D_{ij}$ and a quench resistor $R_{q,ij}$ is connected to a network $N_{S,ij}$. Connected to the network $N_{S,ij}$ is a coder resistor $R_{e,ij}$, which supplies the photocurrent to the output channels as described above using a linear coding. Via a summing resistor $R_{S,ij}$, which is connected to the network $N_S$, the voltage for the second-order moment is tapped off.

Figure 12:
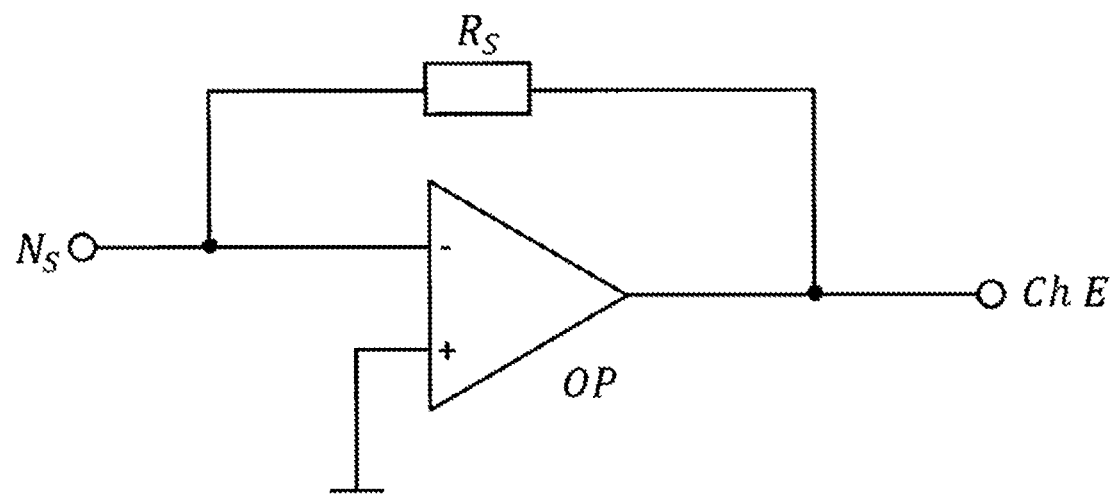
FIG. 12 illustrates an operational amplifier that is negatively fed back.

FIG. 12 shows an operational amplifier OP, which is connected to the summing network $N_S$ at its negative input and connected to a ground at its positive output. The operational amplifier ends in the output channel E and has a negative feedback via a resistor $R_S$ from the output channel.

Figure 13:
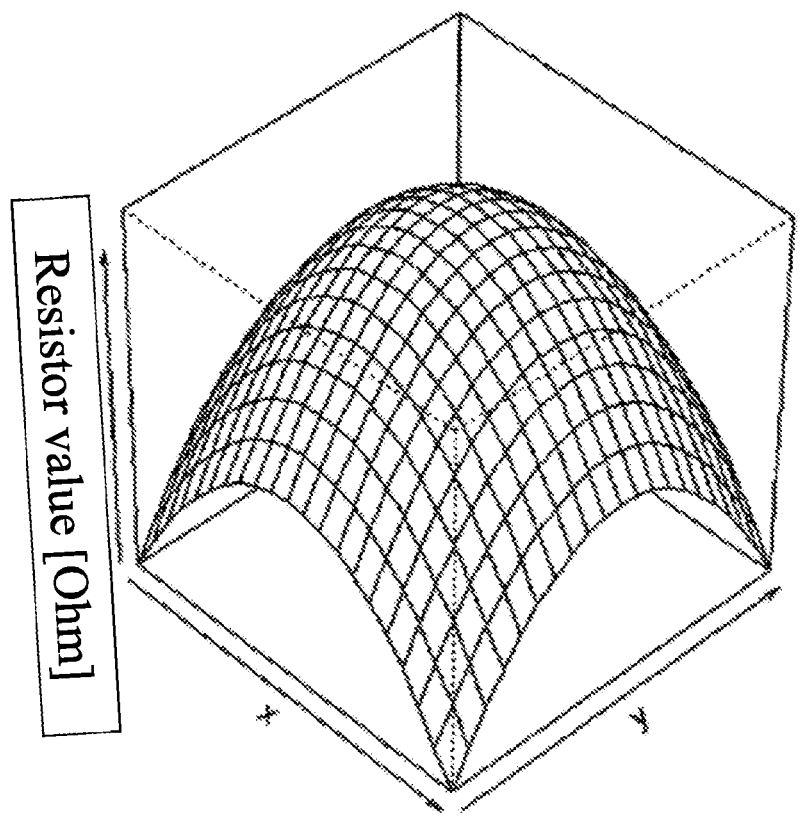
FIG. 13 illustrates a coder resistor distribution.

FIG. 13 shows the 2D coder resistor distribution on the xy plane of the sensor chip, where the z-axis indicates the resistance value in ohms for an exactly square coding.

Figure 14:
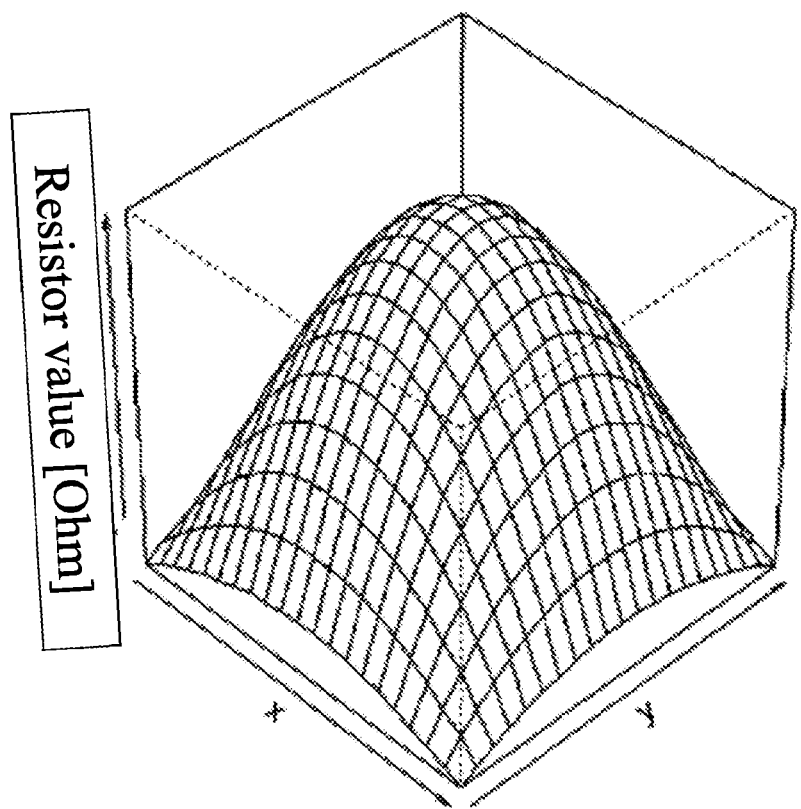
FIG. 14 illustrates a coder resistor distribution.

FIG. 14 shows the 2D coder resistor distribution on the xy plane of the sensor chip, where the z-axis indicates the resistance value in ohms for a coding that deviates from the exact quadratic coding but realizes the invention according to formula (8).

Figure 15:
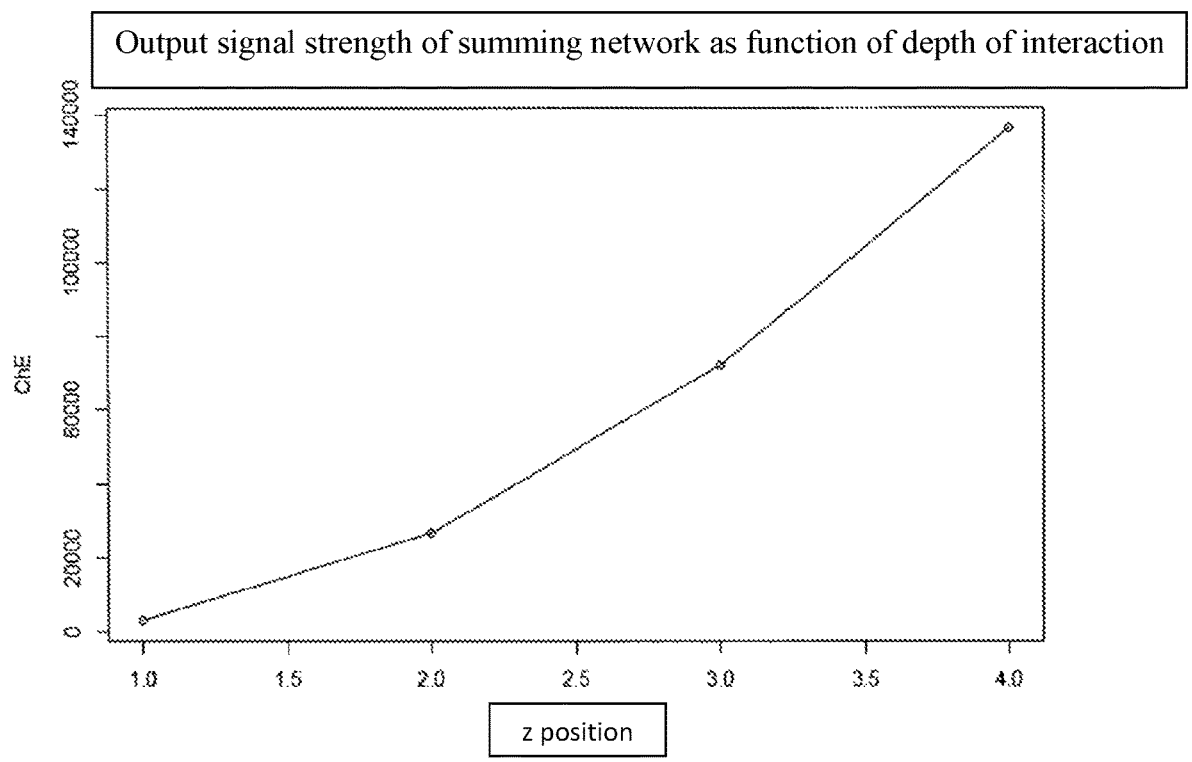
FIG. 15 illustrates the output signal strength of the summing network as a function of the depth of interaction.

FIG. 15 shows the output signal strength of the summing network as a function of the depth of interaction. The x-axis indicates the z position in the scintillation crystal, which is normalized. The y-axis indicates the output signal strength at channel E, in any unit.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCES

[1]: Gola, A., et al., "A Novel Approach to Position-Sensitive Silicon Photomultipliers: First Results."
[2]: Schulz, V., et al., "Sensitivity encoded silicon photomultiplier—a new sensor for high-resolution PET-MRI." Physics in medicine and biology 58.14 (2013): 4733.
[3]: Fischer, P., Piemonte, C, "Interpolating silicon photomultipliers", NIMPRA, November 2012.
[4]: Espana, S., et al., "DigiPET: sub-millimeter spatial resolution small animal PET imaging using thin monolithic scintillators."
[5]: Lerche, Ch. W., et al., Depth of interaction detection for y-ray imaging.
[6]: U.S. Pat. No. 7,476,864 (B2).
[7]: Ito, M., et al., "Positron Emission Tomography (PET) Detectors with Depth-of-Interaction (DOI) Capability."
[8]: Judenhofer, M. S., et al., "Simultaneous PET-MRI: a new approach for functional and morphological imaging."
[9]: Ziegler, S. I., et al., "A prototype high-resolution animal positron tomograph with avalanche photodiode arrays and LSO crystals."
[10]: Balcerzyk, M., et al., "Preliminary performance evaluation of a high resolution small animal PET scanner with monolithic crystals and depth-of-interaction encoding."
[11]: Balcerzyk, M., et al., "Initial performance evaluation of a high resolution Albira small animal positron emission tomography scanner with monolithic crystals and depth-of-interaction encoding from a user's perspective."
[12]: Gonzalez Martinez, A. J., et al., "Innovative PET detector concept based on SiPMs and continuous crystals."
[13]: Siegel, S., et al., "Simple Charge Division Readouts for Imaging Scintillator Arrays using a Multi-Channel PMT."
[14]: McElroy, D. P., et al., "First Results From MADPET II: A Novel Detector and Readout System for High Resolution Small Animal PET."
[15]: Berneking, A., "Characterization of Sensitivity encoded Silicon Photomultiplier for high resolution simultaneous PET/MR Imaging," Diploma thesis, RWTH Aachen University, Mar. 12, 2012.

The invention claimed is:
1. An SiPM sensor chip, comprising:
pixels comprising microcells Z, each pixel being associated with an xy position $x_1, x_2, x_3, \ldots, x_N$ or $y_1, y_2, y_3, \ldots y_M$,
wherein a plurality of the pixels form a block,
wherein the microcells are connected to output channels for a linear coding, and
wherein:
 a) in the case of a one-dimensional linear coding in at least one row m of M rows, N pixels $x_1, x_2, \ldots, x_N$ are present in the x direction, and within this row a linear coding is produced in that, within the m rows, the number of microcells of a pixel ending in an output channel $A_m$ belonging to the mth row changes in the progressive direction from $x_1$ to $x_N$ in a numerically decreasing manner, and the number of microcells of a pixel ending in the output channel $B_m$ belonging to the mth row changes in a numerically ascending manner, so that the number of microcells interconnected with $A_m$ or $B_m$ inversely changes linearly with progressing pixels in a row in the x direction, resulting in a linear coding, or
 b) in the case of a one-dimensional linear coding in at least one column n of N columns, M pixels $y_1, y_2, \ldots, y_M$ are present in the y direction, and within this column a linear coding is produced in that, within the n columns, the number of microcells of a pixel ending in the output channel $A_n$ belonging to the nth column changes in the progressive direction from $y_1$ to $y_M$ in a numerically decreasing manner, and the number of microcells of a pixel ending in the output channel $B_n$ belonging to the nth column changes in a numerically ascending manner, so that the number of microcells interconnected with $A_n$ or $B_n$ inversely changes linearly with progressing pixels in a column in the y direction, resulting in a linear coding, or
 c) in the case of a two-dimensional linear coding in at least one row m of M rows, N pixels $x_1, x_2, \ldots, x_N$ are present in the x direction, and within this row a linear coding is produced in that, within the m rows, the number of microcells of a pixel ending in a shared output channel A changes in the progressive direction from $x_1$ to $x_N$ in a numerically decreasing manner, and the number of microcells of a pixel ending in a shared output channel B changes in a numerically ascending manner, so that the number of microcells interconnected with A or B inversely changes linearly with progressing pixels in a row in the x direction, and that in at least one column n of N columns, M pixels $y_1, y_2, \ldots, y_M$ are present in the y direction, and within this column a linear coding is produced in that, within the n columns, the number of microcells of a pixel ending in a shared output channel C changes in the progressive direction from $y_1$ to $y_M$ in a numerically decreasing manner, and the number of microcells of a pixel ending in a shared output channel D changes in a numerically ascending manner, so that the number of microcells interconnected with C or D inversely changes linearly with progressing pixels in a column in the y direction, resulting in a linear coding,
wherein a linear coding is present if a coding is realized according to

$$h_1 \cdot x^{h_2} + h_3$$

$$h_4 \cdot y^{h_5} + h_6$$

$$h_1, h_3, h_4, h_6 = \text{const.} \in [0, \infty)$$

$$0.5 < h_2, h_5 < 1.5$$

and
wherein a summing network O or two summing networks O are implemented, comprising one network or two networks $N_S$ and coder resistors $R_e$ through which the photocurrents of the microcells Z flow, and leading to a voltage distribution through the summing network O or the summing networks O satisfying the distribution formula:

$$p(x,y) = (x - \beta_1)^{(2w_1)^{\alpha_1}} (y - \beta_2)^{(2w_2)^{\alpha_2}}$$

$$\beta_1, \beta_2 = \text{const.} \in [0, \infty)$$

$$w_1, w_2 = 1, 2, 3 \ldots$$

$$0.5 < \alpha_1, \alpha_2 < 1.5$$

or $$p(x) = (x-\beta_1)^{(2w1)^{\alpha_1}}$$

$$p(y) = (y-\beta_2)^{(2w1)^{\alpha_2}}$$

$$\beta_1, \beta_2 = \text{const.} \in [0, \infty)$$

$$w_1, w_2 = 1, 2, 3 \ldots$$

$$0.5 < \alpha_1, \alpha_2 < 1.5$$

which can be coded along x or y or x and y.

2. The SiPM sensor chip according to claim 1, wherein the microcells of a pixel along N pixels of the x-axis with the pixel positions $x_1, x_2, \ldots x_N$ that lead to the channel $A_m$ or A are locally located numerously on the side nearer the position $x_1$ and the microcells of the same pixel that lead to the channel $B_m$ or B are located on the side nearer the position $x_N$.

3. The SiPM sensor chip according to claim 2, wherein the microcells of a pixel along M pixels of the y-axis with the pixel positions $y_1, y_2, \ldots y_M$ that lead to the channel $A_n$ or C are locally located numerously on the side nearer the position $y_1$ and the microcells of the same pixel that lead to the channel $B_n$ or D are located on the side nearer the position $y_M$.

4. The SiPM sensor chip according to claim 2, wherein the transition of the distribution of microcells to the channels $A_m$ and $B_m$ or A and B and/or C and D within a pixel is fluid.

5. The SiPM sensor chip according to claim 2, wherein the microcells that lead to the channel $A_m$ or A are separated by a discrete border from the microcells that lead to the channel $B_m$ or B, and/or the microcells that lead to the channel C are separated by a discrete border from the microcells that lead to the channel D.

6. The SiPM sensor chip according to claim 1, wherein a pixel is subdivided into sectors, each of which realizes the local coding pattern of the pixel in which they are located.

7. The SiPM sensor chip according to claim 1, wherein the summing network O includes an operational amplifier OP, wherein the summing resistors $R_S$ are connected to the operational amplifier OP.

8. The SiPM sensor chip according to claim 1, wherein the microcells Z of a pixel that are provided in the one-dimensional case a) for connection to the channels $A_m/B_m$ or in the one-dimensional case b) for connection to the channels $A_n/B_n$ are connected to a network $N_{S,nm,Am/An}$ or $N_{S,nm,Bm/Bn}$, where the network $N_{S,nm,Am/An}$ is connected to a coder resistor $R_{e,nm,Am/An}$ and to a summing resistor $R_{S,nm,Am/An}$ and the network $N_{S,nm,Bm/Bn}$ is connected to a coder resistor $R_{e,nm,Bm/Bn}$ and to a summing resistor $R_{S,nm,Bm/Bn}$.

9. The SiPM sensor chip according to claim 1, wherein the microcells Z of a pixel that are provided in the two-dimensional case c) for connection to the channels A, B, C, and D are connected to a network $N_{S,nm,A}$ or $N_{S,nm,B}$, $N_{S,nm,C}$, $N_{S,nm,D}$, where the network $N_{S,nm,A}$ is connected to a coder resistor $R_{e,nm,A}$ and a summing resistor $R_{S,nm,A}$, the network $N_{S,nm,B}$ is connected to a coder resistor $R_{e,nm,B}$ and a summing resistor $R_{S,nm,B}$, the network $N_{S,nm,C}$ is connected to a coder resistor $R_{e,nm,C}$ and a summing resistor $R_{S,nm,C}$, and the network $N_{S,nm,D}$ is connected to a coder resistor $R_{e,nm,D}$ and a summing resistor $R_{S,nm,D}$.

10. The SiPM sensor chip according to claim 1, wherein at least two microcells $Z_{ij}$ of a row l and/or a column k are combined by lines to form in each case at least one field f connected to a network $N_{S,f}$ and at least one network $N_{S,f}$ is connected to a coder resistor $R_{e,f}$ and a summing resistor $R_{S,f}$, where each coder resistor $R_{e,f}$ is connected to the channels $A_m$ or $B_m$ and $A_n$ or $B_n$ or A, B, C or D.

11. The SiPM sensor chip according to claim 1, wherein the outputs of individual microcells $Z_{ij}$ are each connected to a network $N_{S,ij}$ that is connected to a coder resistor $R_{e,ij}$ and a summing resistor $R_{S,ij}$, where each coder resistor $R_{e,ij}$ is connected to the channels $A_m$ or $B_m$ and $A_n$ or $B_n$ or A, B, C or D.

12. The SiPM sensor chip according to claim 1, wherein the summing network O is completely integrated into the SiPM sensor chip.

13. The SiPM sensor chip according to claim 1, wherein the pixels are arranged in rows in the x direction and rows in the y direction, wherein the rows x and y are orthogonal or inclined at an angle <90° to each other, so that a diamond pattern results.

14. The SiPM sensor chip according to claim 1, wherein a plurality of sensor chips are arranged in a grid so as to form a block a×b, where the linear position coding and the quadratic coding of the potentials extends sensor-spanning across a plurality of sensor chips in the directions a and b.

15. The SiPM sensor chip according to claim 1, wherein the sensor chip has a plurality of J blocks where blocks j=1 . . . J, each designed according to claim 1 and the sensor chip having separate output channels $A_j$, $B_j$, $C_j$ and $D_j$, as well as $E_j$ and/or $F_j$ for each block j.

16. The SiPM sensor chip according to claim 1, wherein the pixels are arranged at pitches from each other that correspond to the distances of the microcells.

17. An SiPM sensor chip, comprising:
pixels comprising microcells Z, each pixel being associated with an xy position $x_1, x_2, x_3, \ldots, x_N$ or $y_1, y_2, y_3, \ldots y_M$,
wherein a plurality of the pixels form a block,
wherein the microcells are connected to output channels for a linear coding, and
wherein:
  a) in the case of a one-dimensional linear coding in at least one row m of M rows, N pixels $x_1, x_2, \ldots, x_N$ are present in the x direction, and within this row a linear coding is produced in that, within the m rows, the number of microcells of a pixel ending in an output channel $A_m$ belonging to the mth row changes in the progressive direction from $x_1$ to $x_N$ in a numerically decreasing manner, and the number of microcells of a pixel ending in the output channel $B_m$ belonging to the mth row changes in a numerically ascending manner, so that the number of microcells interconnected with $A_m$ or $B_m$ inversely changes linearly with progressing pixels in a row in the x direction, resulting in a linear coding, or
  b) in the case of a one-dimensional linear coding in at least one column n of N columns, M pixels $y_1, y_2, \ldots, y_M$ are present in the y direction, and within this column a linear coding is produced in that, within the n columns, the number of microcells of a pixel ending in the output channel $A_n$ belonging to the nth column changes in the progressive direction from $y_1$ to $y_M$ in a numerically decreasing manner, and the number of microcells of a pixel ending in the output channel $B_n$ belonging to the nth column changes in a numerically ascending manner, so that the number of microcells interconnected with $A_n$ or $B_n$ inversely changes linearly with progressing pixels in a column in the y direction, resulting in a linear coding.

* * * * *